(12) United States Patent
Cho et al.

(10) Patent No.: US 11,508,851 B2
(45) Date of Patent: Nov. 22, 2022

(54) SEMICONDUCTOR DEVICE

(71) Applicant: SAMSUNG ELECTRONICS CO., LTD., Suwon-si (KR)

(72) Inventors: Minhee Cho, Suwon-si (KR); Hyunmog Park, Seoul (KR); Minwoo Song, Seongnam-si (KR); Woobin Song, Hwaseong-si (KR); Hyunsil Oh, Hwaseong-si (KR); Minsu Lee, Seongnam-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 72 days.

(21) Appl. No.: 17/004,427

(22) Filed: Aug. 27, 2020

(65) Prior Publication Data
US 2021/0217897 A1   Jul. 15, 2021

(30) Foreign Application Priority Data
Jan. 15, 2020 (KR) .................. 10-2020-0005599

(51) Int. Cl.
| H01L 27/00 | (2006.01) |
| H01L 29/00 | (2006.01) |
| H01L 29/786 | (2006.01) |
| H01L 27/12 | (2006.01) |
| H01L 29/49 | (2006.01) |
| H01L 29/24 | (2006.01) |

(52) U.S. Cl.
CPC ...... *H01L 29/78648* (2013.01); *H01L 27/127* (2013.01); *H01L 27/1225* (2013.01); *H01L 29/7869* (2013.01); H01L 27/1207 (2013.01); H01L 29/24 (2013.01); H01L 29/4908 (2013.01)

(58) Field of Classification Search
CPC ............... H01L 27/1225; H01L 27/127; H01L 27/1207; H01L 29/78648; H01L 29/7869; H01L 29/24; H01L 29/4908
See application file for complete search history.

(56) References Cited

U.S. PATENT DOCUMENTS

| 8,217,680 B2 | 7/2012 | Kim et al. |
| 8,384,076 B2 | 2/2013 | Park |
| (Continued) | | |

OTHER PUBLICATIONS

Kunitake, et al., "A c-Axis-Aligned Crystalline In—Ga—Zn Oxide FET With a Gate Length of 21 nm Suitable for Memory Applications", Journal of the Electron Devices Society, vol. 7, 2019, pp. 495-502.

*Primary Examiner* — Nikolay K Yushin
(74) *Attorney, Agent, or Firm* — F. Chau & Associates, LLC

(57) ABSTRACT

A semiconductor device includes: a substrate including an active region and a device isolation region; a flat plate structure formed on the substrate; an oxide semiconductor layer covering a top surface of the flat plate structure and continuously arranged on a top surface of the substrate in the active region and the device isolation region; a gate structure arranged on the oxide semiconductor layer and including a gate dielectric layer and a gate electrode; and a source/drain region arranged on both sides of the gate structure and formed in the oxide semiconductor layer, in which, when viewed from a side cross-section, an extending direction of the flat plate structure and an extending direction of the gate structure cross each other.

20 Claims, 37 Drawing Sheets

(56) References Cited

U.S. PATENT DOCUMENTS

| | | |
|---|---|---|
| 9,105,728 B2 | 8/2015 | Hong et al. |
| 9,240,492 B2 | 1/2016 | Yamazaki |
| 10,475,818 B2 * | 11/2019 | Ando ................... H01L 27/1288 |
| 2017/0317111 A1 * | 11/2017 | Ando ................... H01L 29/7869 |
| 2019/0067375 A1 | 2/2019 | Karda et al. |
| 2019/0221567 A1 | 7/2019 | Sandhu |
| 2019/0296018 A1 | 9/2019 | Cho et al. |

* cited by examiner

Y – Y'

X – X'

Y – Y'

Y – Y'

Y – Y'

SEMICONDUCTOR DEVICE

CROSS-REFERENCE TO RELATED APPLICATION

This application claims the benefit under 35 U.S.C. § 119 of Korean Patent Application No. 10-2020-0005599, filed on Jan. 15, 2020, in the Korean Intellectual Property Office, the disclosure of which is incorporated by reference herein in its entirety.

TECHNICAL FIELD

The present inventive concept relates to a semiconductor device and a method of fabricating the same, and more particularly, to a semiconductor device including an oxide semiconductor layer and a method of fabricating the same.

DISCUSSION OF RELATED ART

Electronic devices have become more compact and lighter according to the rapid development of electronic industry and the rising demand of users. Accordingly, semiconductor devices as key devices in modern electronics having a high degree of integration are required, and at the same time, tighter design rules may require a continuous reduction in device feature size. In addition, the demand for high-speed semiconductor devices is also increasing. To satisfy the demand for high integration and high speed of such semiconductor devices, various studies have been conducted.

SUMMARY

The present inventive concept provides a semiconductor device in which oxide semiconductor layers are continuously formed across a plurality of active regions of a substrate without etching them, and each transistor is electrically separable, and a method of fabricating the semiconductor device.

The problems to be solved by the technical idea of the present inventive concept are not limited to the above-mentioned issues, and other matters not mentioned may be clearly understood by those of ordinary skill in the art from the following description.

According to an exemplary embodiment of the present inventive concept, there is provided a semiconductor device including: a substrate including an active region and a device isolation region; a flat plate structure formed on the substrate; an oxide semiconductor layer covering a top surface of the flat plate structure and continuously arranged on a top surface of the substrate in the active region and the device isolation region; a gate structure arranged on the oxide semiconductor layer and including a gate dielectric layer and a gate electrode; and a source/drain region arranged on both sides of the gate structure and formed in the oxide semiconductor layer, in which, when viewed from a side cross-section, an extending direction of the flat plate structure and an extending direction of the gate structure cross each other.

According to an exemplary embodiment of the present inventive concept, there is provided a semiconductor device including: a substrate configured to define a plurality of active regions; an insulating layer covering a top surface of the substrate; a gate electrode formed on the insulating layer and extending in a first direction; a gate dielectric layer covering the insulating layer and the gate electrode; an oxide semiconductor layer arranged on the gate dielectric layer and configured to form a channel region in each of the plurality of active regions; a plurality of contact structures electrically connected to the oxide semiconductor layer; and an upper gate metal layer formed between each of adjacent two of the plurality of active regions, in which a device isolation insulating layer is not formed between each adjacent two of the plurality of active regions.

According to an exemplary embodiment of the present inventive concept, there is provided a semiconductor device including: a substrate including a device isolation region configured to define a plurality of active regions; a first insulating layer formed on the substrate; a lower gate metal layer covering all of the plurality of active regions and the device isolation region of the substrate, being on the first insulating layer, and being configured to operate for device isolation; a second insulating layer formed on the lower gate metal layer; an oxide semiconductor layer arranged on the second insulating layer and configured to form a channel region in each of the plurality of active regions; a plurality of gate structures each arranged on the channel region in each of the plurality of active regions; a source/drain region arranged on both sides of each of the plurality of gate structures and formed in the oxide semiconductor layer; a contact structure electrically connected to the source/drain region; and a lower gate metal layer contact electrically connected to the lower gate metal layer.

BRIEF DESCRIPTION OF THE DRAWINGS

Exemplary embodiments of the present inventive concept will be more clearly understood from the following detailed description taken in conjunction with the accompanying drawings in which.

Figure 1A:
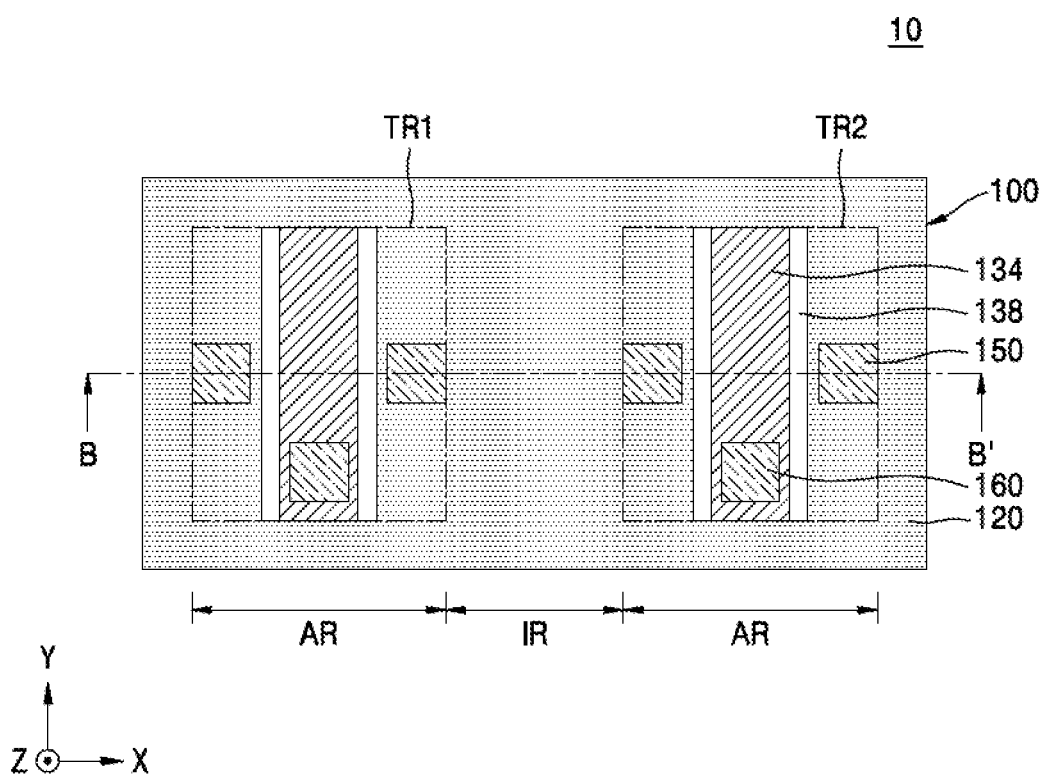
FIG. 1A is a plan view of a semiconductor device according to an exemplary embodiment of the present inventive concept.

Since the drawings in FIGS. 1-18 are intended for illustrative purposes, the elements in the drawings are not necessarily drawn to scale. For example, some of the elements may be enlarged or exaggerated for clarity purpose.

DETAILED DESCRIPTION OF THE EMBODIMENTS

Hereinafter, exemplary embodiments of the present inventive concept are described in detail with reference to the accompanying drawings.

Figure 1B:
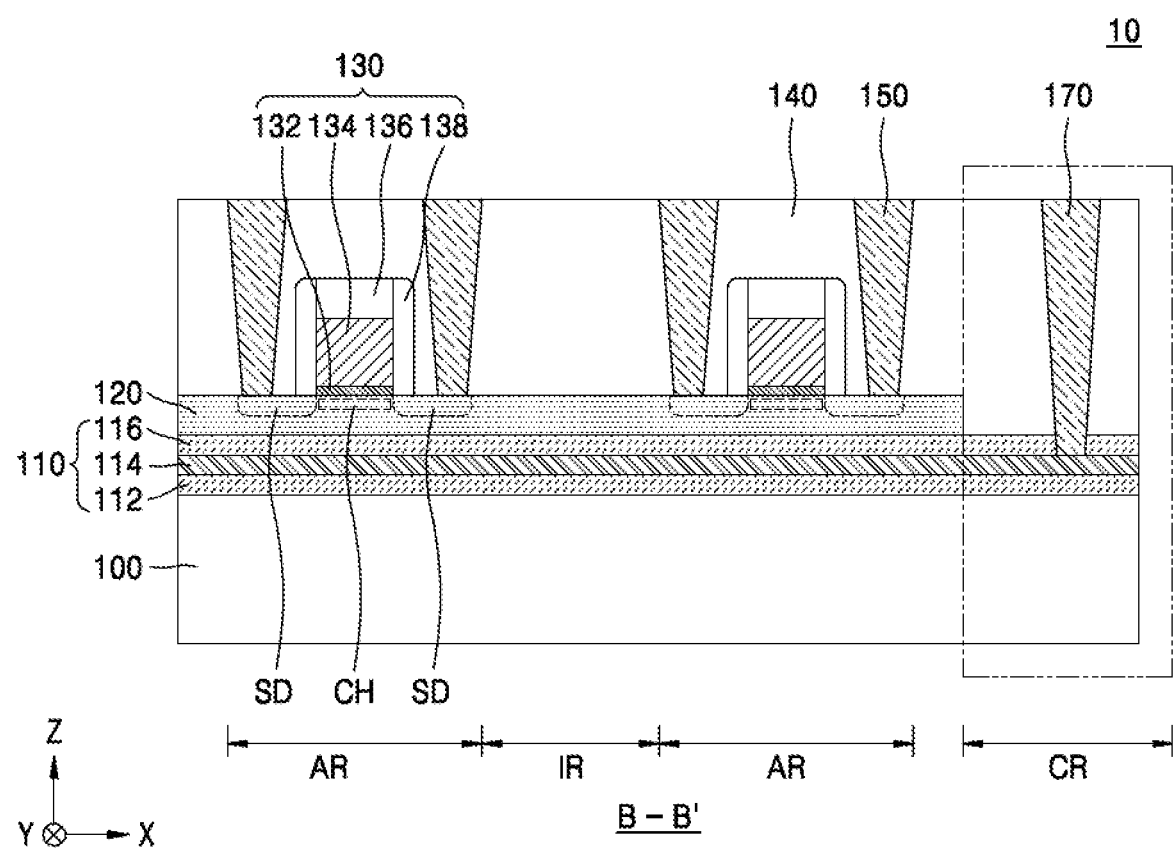
FIG. 1B is a cross-sectional view of the semiconductor device taken along line B-B' of FIG. 1A.

FIG. 1A is a plan view of a semiconductor device 10 according to an exemplary embodiment of the present inventive concept, and FIG. 1B is a cross-sectional view of the semiconductor device 10 taken along line B-B' of FIG. 1A.

Referring to FIGS. 1A and 1B, the semiconductor device 10 includes a flat plate structure 110, an oxide semiconductor layer 120, a gate structure 130, a contact plug 150, and a gate contact 160, which are disposed on a substrate 100.

The substrate 100 may include a wafer including, for example, silicon (Si). In an exemplary embodiment of the present inventive concept, the substrate 100 may include a wafer including a semiconductor element such as, for example, germanium (Ge), or a compound semiconductor such as, for example, silicon carbide (SiC), gallium arsenide (GaAs), gallium phosphide (GaP), gallium antimonide (GaSb), indium antimonide (InSb), indium arsenide (InAs), indium phosphide (InP), indium gallium arsenide (InGaAs), cadmium selenide (CdSe), cadmium sulfide (CdS), cadmium telluride (CdTe), zinc oxide (ZnO), zinc selenide (ZnSe), zinc sulfide (ZnS), or zinc telluride (ZnTe). The substrate 100 may have a silicon on insulator (SOI) structure. The substrate 100 may include a conductive region, for example, a well doped with impurities, or a structure doped with impurities. In addition, the substrate 100 may include one or more semiconductor layers or structures, and may include active or operable portions of semiconductor devices.

The flat plate structure 110 may be formed on the substrate 100. The flat plate structure 110 may include a first insulating layer 112, a lower gate metal layer 114, and a second insulating layer 116 sequentially stacked on the substrate.

To function as a physical barrier layer and as an electrical insulating layer, the first insulating layer 112 and the second insulating layer 116 may each include an inorganic insulating material. For example, the first insulating layer 112 and the second insulating layer 116 may each include at least one of silicon oxide ($SiO_2$), silicon nitride ($Si_3N_4$), or aluminum oxide ($Al_2O_3$). For example, the first insulating layer 112 or the second insulating layer 116 may function as a buffer layer for reducing stress due to a lattice constant difference between a material constituting the substrate 100 and a material constituting the oxide semiconductor layer 120. In addition, the first insulating layer 112 or the second insulating layer 116 may prevent impurities such as hydrogen (H) atoms from diffusing into the inside of the oxide semiconductor layer 120 from the substrate 100, and may function as a barrier layer to prevent current flowing inside the oxide semiconductor layer 120 from leaking into the substrate 100. In an exemplary embodiment of the present inventive concept, since silane ($SiH_4$) gas and ammonia ($NH_3$) gas may be used to form silicon nitride ($Si_3N_4$), and hydrogen (H) atoms may be included in silicon nitride ($Si_3N_4$) film, the second insulating layer 116 in direct contact with the oxide semiconductor layer 120 may not include silicon nitride ($Si_3N_4$) and may include, for example, silicon oxide ($SiO_2$) and/or aluminum oxide ($Al_2O_3$). The second insulating layer 116 including silicon oxide ($SiO_2$) and/or aluminum oxide ($Al_2O_3$) may prevent or suppress an upward movement of any hydrogen (H) atoms into the oxide semiconductor layer 120.

The lower gate metal layer 114 may be interposed between the first insulating layer 112 and the second insulating layer 116. The lower gate metal layer 114 may include, for example, doped polysilicon (p-Si), metal, metal nitride, metal silicide, or a combination thereof. In an exemplary embodiment of the present inventive concept, the lower gate metal layer 114 may include at least one of, for example, nickel (Ni), cobalt (Co), or ruthenium (Ru). As described later, when a certain voltage is applied via a lower gate metal layer contact 170, the lower gate metal layer 114 may cause the oxide semiconductor layer 120 to operate locally in an insulated state. Accordingly, although the oxide semiconductor layer 120 is formed without isolation, transistors may be electrically isolated by applying a voltage onto the lower gate metal layer 114 through the lower gate metal layer contact 170.

A top surface of the lower gate metal layer 114 may have a planar structure, and the lower gate metal layers 114 may be continuously connected to each other over the substrate 100. In other words, the lower gate metal layers 114 may be formed to have the same thickness across an active region AR and a device isolation region IR of the substrate 100.

The oxide semiconductor layer 120 may be formed on the second insulating layer 116 of the flat plate structure 110. The oxide semiconductor layer 120 may have a flat top surface, may be configured to operate for device isolation, and may be continuously formed to cover a top surface of the flat plate structure 110 in the active region AR and the device isolation region IR. A level of the top surface of the oxide semiconductor layer 120 may be higher than a level of the top surface of the substrate 100.

The oxide semiconductor layer 120 may include an oxide having electrical conductivity, for example, a homologous oxide. In this case, the homologous oxide may mean a material having a formula of $RAO_3(MO)_m$ (in which R is selected from one element of, for example, scandium (Sc), ytterbium (Yb), lutetium (Lu), and indium (In); A is selected from one element of, for example, gallium (Ga), aluminum (Al), Iron (Fe), and indium (In); M is selected from one element of, for example, zinc (Zn) and magnesium (Mg); and m is an integer). However, the elements R, A, and M that may be included in the homologous oxide are not limited thereto. For example, the oxide semiconductor layer 120 may include at least one of, for example, indium gallium zinc oxide (InGaZnO), indium gallium silicon oxide (InGaSiO), indium tin zinc oxide (InSnZnO), indium zinc oxide (InZnO), or hafnium indium zinc oxide (HfInZnO). For example, in an exemplary embodiment of the present inventive concept, the oxide semiconductor layer 120 may include indium gallium zinc oxide (InGaZnO) formed of indium (In), gallium (Ga), zinc (Zn) and oxygen (O), and also known as IGZO, or a-IGZO in its amorphous form ($In_2Ga_2ZnO_7$) or crystalline form ($InGaZnO_4$).

In an exemplary embodiment of the present inventive concept, the oxide semiconductor layer 120 may have an amorphous structure or a c-axis aligned crystal structure. For example, when the oxide semiconductor layer 120 includes an indium gallium zinc oxide (InGaZnO) layer having the c-axis aligned crystal structure, the oxide semiconductor layer 120 may have an YbFeO-type crystal structure. This c-axis aligned crystal structure makes the out-of-plane direction (along the c axis) and the in-plane direction (in the a-b plane) two distinct crystalline directions. In the YbFeO-type crystal structure, an InO layer having a hexagonal arrangement may be arranged in a layered structure in the c-axis direction, and a (Ga, Zn)O layer may be between two adjacent InO layers. However, the crystal structure of the oxide semiconductor layer 120 is not limited thereto.

In an exemplary embodiment of the present inventive concept, at least one impurity of, for example, fluorine (F), hydrogen (H), nitrogen (N), magnesium (Mg), yttrium (Y), ruthenium (Ru), or arsenic (As) may be doped in the oxide semiconductor layer 120. Doping with p-type or n-type impurities, the oxide semiconductor layer 120 may increase conductivity. For example, many crystalline oxide semiconductors may be doped with hydrogen (H) to achieve high conductivity due to forming the donor level above conduction band. For example, to dope impurities onto the oxide semiconductor layer 120, impurities may be doped in-situ in a process of forming the oxide semiconductor layer 120, or impurity ions may be ion implanted after the oxide semiconductor layer 120 is formed.

The active region AR may be defined in the oxide semiconductor layer 120. For example, the oxide semiconductor layer 120 may include the active region AR constituting a first transistor TR1, and the oxide semiconductor layer 120 may include the active region AR constituting a second transistor TR2. The first transistor TR1 and the second transistor TR2 may be formed in different active regions AR. In an exemplary embodiment of the present inventive concept, the first transistor TR1 may include an NMOS transistor, and the second transistor TR2 may include a PMOS transistor, but the present inventive concept is not limited thereto.

The first transistor TR1 and the second transistor TR2 may be partial components of a volatile semiconductor memory device such as, for example, dynamic random access memory (RAM) (DRAM) or static RAM (SRAM), or may be included as partial components of a nonvolatile semiconductor memory device such as, for example, phase-change RAM (PRAM), magnetoresistive RAM (MRAM), ferroelectric RAM (FeRAM), or resistive RAM (RRAM).

The semiconductor device 10 according to an exemplary embodiment of the present inventive concept, as illustrated in the drawing, has been described as a planar-type transistor, but the present inventive concept is not limited thereto. For example, the semiconductor device 10 according to an exemplary embodiment of the present inventive concept may include, for example, a fin-type transistor including a fin-type active region, a tunneling field effect transistor (FET), a transistor including a nanowire, a transistor including a nano-sheet (that is, multi bridge channel FET (MBCFET)®), or a various three-dimensional (3D) transistor.

The top surface of the oxide semiconductor layer 120 may have a planar structure, and the oxide semiconductor layers 120 may be continuously connected to each other over the substrate 100. In other words, the oxide semiconductor layer 120 may be formed to have the same thickness across the active region AR and the device isolation region IR of the substrate 100.

The semiconductor device 10 of the present inventive concept may not include physical components such as a device isolation structure (that is, a device isolation layer or a device isolation trench) in the device isolation region IR.

When a certain voltage is applied via the lower gate metal layer contact 170 electrically connected to the lower gate metal layer 114, the oxide semiconductor layer 120 may operate in an insulation state. Accordingly, although the oxide semiconductor layer 120 is formed without isolation, the active regions AR may be electrically isolated by applying a voltage onto the lower gate metal layer 114 through the lower gate metal layer contact 170.

The gate structures 130 may be spaced apart from each other in a first direction (X direction) on the oxide semiconductor layer 120, and may extend in a second direction (Y direction). In an exemplary embodiment of the present inventive concept, each of the gate structures 130 may be of planar type, but the present inventive concept is not limited thereto. The gate structure 130 may include a gate dielectric layer 132, a gate electrode 134, a gate capping layer 136, and a gate spacer 138. When viewed from the side cross-sectional view shown in FIG. 1B, the flat plate structure 110 is extending in the first direction (X direction) which may cross the extending direction, for example, the second direction (Y direction) of the gate structure 130.

The gate dielectric layer 132 may be formed on the oxide semiconductor layer 120. The gate dielectric layer 132 may include, for example, a silicon oxide ($SiO_2$) layer, a silicon oxynitride (SiON) layer, a high dielectric constant (high-k) layer having a dielectric constant higher than that of the silicon oxide ($SiO_2$) layer, or a combination thereof. The high-k layer may include a metal oxide or a metal oxynitride. For example, the high-k layer usable as the gate dielectric layer 132 may include, for example, hafnium oxide ($HfO_2$), hafnium silicon oxide (HfSiO), hafnium silicon oxynitride (HfSiON), hafnium tantalum oxide (HfTaO), hafnium titanium oxide (HfTiO), hafnium zirconium oxide (HfZrO), hafnium aluminum oxide (HfAlO), zirconium oxide ($ZrO_2$), titanium oxide ($TiO_2$), yttrium oxide ($Y_2O_3$), tantalum oxide ($Ta_2O_5$), lanthanum oxide ($La_2O_3$), lanthanum aluminum oxide (LaAlO), lanthanum hafnium oxide (LaHfO), aluminum oxide ($Al_2O_3$), or a combination thereof, but the present inventive concept is not limited thereto.

The gate electrode 134 may be formed on the gate dielectric layer 132. The gate electrode 134 may cover a top surface of the gate dielectric layer 132, and may extend in the second direction (Y direction). The gate electrode 134 may include, for example, doped polysilicon (p-Si), metals, or a combination thereof. For example, the gate electrode 134 may include metals including at least one of, for example, tungsten (W), aluminum (Al), cobalt (Co), titanium (Ti), tantalum (Ta), copper (Cu), molybdenum (Mo), or a metal alloy thereof. For example, the gate electrode 134 may include a metal silicide material such as, for example, nickel silicide ($NiSi_2$), titanium silicide ($TiSi_2$), tungsten silicide ($WSi_2$), or cobalt silicide ($CoSi_2$).

The gate capping layer 136 may be formed on the gate electrode 134. The gate capping layer 136 may cover a top surface of the gate electrode 134, and may extend in the second direction (Y direction). For example, the gate capping layer 136 may include, for example, silicon oxynitride (SiON), silicon carbonitride (SiCN), silicon carbon oxynitride (SiCON), or silicon nitride ($Si_3N_4$).

The gate spacer 138 may be formed on both sidewalls of the gate dielectric layer 132, the gate electrode 134, and the gate capping layer 136, and may extend in the second direction (Y direction). The gate spacer 138 may include, for example, silicon oxide ($SiO_2$), silicon nitride ($Si_3N_4$), silicon oxynitride (SiON), silicon carbonitride (SiCN), silicon oxycarbonitride (SiOCN), or a combination thereof.

In an exemplary embodiment of the present inventive concept, the gate spacer 138 may include multiple layers including different materials from each other. Although the gate spacer 138 is illustrated as including a single layer in FIG. 1B, but the present inventive concept is not limited thereto. For example, in an exemplary embodiment of the present inventive concept, the gate spacer 138 may include a first spacer layer, a second spacer layer, and a third spacer layer, that are sequentially formed. The first spacer layer and the third spacer layer may include, for example, silicon nitride ($Si_3N_4$), silicon oxide ($SiO_2$), or silicon oxynitride (SiON). The second spacer layer may include an insulating material having a lower dielectric constant than the first spacer layer, and may include, for example, an air gap.

A source/drain region SD may be formed inside the oxide semiconductor layer 120 on both sides of the gate structure 130. In other words, two source/drain regions SD may be formed inside the oxide semiconductor layer 120, with one located on one side of the gate structure 130 and the other one located on the opposite side of the gate structure 130. In addition, a channel region CH may be formed inside the oxide semiconductor layer 120 and arranged under the gate structure 130, in which a top surface of the oxide semiconductor layer 120 has a planar structure. A p-type impurity or an n-type impurity may be doped in the source/drain region SD.

An interlayer insulating layer 140 may be formed on the oxide semiconductor layer 120 to cover the gate structure 130. The interlayer insulating layer 140 may include, for example, silicon oxide ($SiO_2$), silicon nitride ($Si_3N_4$), silicon oxynitride (SiON), tetraethyl orthosilicate (TEOS), or a low dielectric material having a low dielectric constant of about 2.2 to about 2.4. As an example, the low-k dielectric material may include carbon-doped silicon oxide, such as SiCOH.

The contact plug 150 may penetrate the interlayer insulating layer 140, and may be electrically connected to the source/drain region SD. In addition, the gate contact 160 may penetrate the interlayer insulating layer 140 and the gate capping layer 136, and may be electrically connected to the gate electrode 134.

The contact plug 150 and the gate contact 160 may include, for example, doped polysilicon (p-Si), metal, metal nitride, metal silicide, or a combination thereof. In an exemplary embodiment of the present inventive concept, the contact plug 150 and the gate contact 160 may be formed in a double-layer structure including a metal buried layer and a conductive barrier layer that surrounds side surfaces and bottom surfaces of the metal buried layer.

The metal buried layer may include at least one of, for example, cobalt (Co), tungsten (W), nickel (Ni), ruthenium (Ru), copper (Cu), aluminum (Al), a silicide thereof, or an alloy thereof. In addition, the conductive barrier layer may include, for example, titanium (Ti), tantalum (Ta), ruthenium (Ru), titanium nitride (TiN), tantalum nitride (TaN), or a combination thereof, but the present inventive concept is not limited thereto. Although one contact plug 150 is illustrated as being on both sides of the gate structure 130, for example, each side having one contact plug 150, in FIG. 1B, two or more contact plugs 150 may be on both sides thereof.

In an exemplary embodiment of the present inventive concept, in the contact region CR being spaced apart by a certain distance from the active region AR in which the gate structure 130 is arranged, the lower gate metal layer contact 170 may penetrate the interlayer insulating layer 140 and the second insulating layer 116, and may be electrically connected to the lower gate metal layer 114. The lower gate metal layer contact 170 may not be in contact with the oxide semiconductor layer 120. Accordingly, a level of a bottom surface of the contact plug 150 may be higher than a level of a bottom surface of the lower gate metal layer contact 170. The lower gate metal layer contact 170 may include, for example, doped polysilicon (p-Si), metal, metal nitride, metal silicide, or a combination thereof. In an exemplary embodiment of the present inventive concept, similar to the contact plug 150 and the gate contact 160, the lower gate metal layer contact 170 may be formed in a double-layer structure including a metal buried layer and a conductive barrier layer that surrounds side surfaces and bottom surfaces of the metal buried layer.

Although one lower gate metal layer contact 170 is illustrated as being on one side of the substrate 100 in FIG. 1B, the present inventive concept is not limited thereto. In addition, a location of the lower gate metal layer contact region CR is not limited to the location illustrated in FIG. 1B.

Electronic devices have become more compact and lighter according to the rapid development of electronic industry and the rising demands of users. Accordingly, semiconductor devices as key devices in modern electronics having a high degree of integration are required, and at the same time, tighter design rules may require a continuous reduction in device feature size. In addition, the demand for high-speed semiconductor devices is also increasing. To satisfy the demand for high integration and high speed of the semiconductor devices, various studies have been conducted.

Technology for solving a patterning process issue of oxide semiconductors is also one of the various studies. The oxide semiconductors are materials used in the semiconductor devices to reduce leakage current in the channel region CH. In the case of the oxide semiconductor (for example, InGaZnO), it may be generally difficult to form an array structure having a pitch of about 100 nm or less. This is because, in the case of dry etching of the oxide semiconductor, an etching by-product adheres to wall surfaces of a process chamber and is not removed therefrom, and thus there may be an issue that the oxide semiconductor may be contaminated. Thus, there may be difficulties in a process of fabricating an array structure in which the oxide semiconductor is dry-etched to have a fine pitch and a device isolation structure is formed within the fine pitch.

To solve the above described issue, the semiconductor device 10 according to an exemplary embodiment of the present inventive concept may provide a structure in which an electrical insulation may be created between the gate structures 130 without etching the oxide semiconductor layer 120. It has been confirmed that when a certain negative bias is applied to the oxide semiconductor layer 120, an off-state ($I_{off}$) leakage current of the oxide semiconductor layer 120 is measured as about 1e-20 A/μm.

The fact that the $I_{off}$ is about 1e-20 A/μm may be interpreted as meaning that the oxide semiconductor layer 120 operates like an insulating material such as silicon oxide ($SiO_2$). Accordingly, the semiconductor device 10 according to an exemplary embodiment of the present inventive concept may implement an array structure having the same feature size as a general semiconductor device that does not use the oxide semiconductor layer 120.

The certain negative bias may be applied to the oxide semiconductor layer 120 via the flat plate structure 110, for example, via the lower gate metal layer 114 of the flat plate structure 110. When about −0.5 V to about −1 V, or, for example, about −0.7 V, is applied to the oxide semiconductor layer 120 via the lower gate metal layer 114 of the flat plate structure 110, the oxide semiconductor layer 120 may operate in an insulated state. Alternatively, when the lower gate metal layer 114 of the flat plate structure 110 includes a p-type metal having a work function of about 4.5 eV or more such as, for example, nickel (Ni), cobalt (Co), or ruthenium (Ru), the oxide semiconductor layer 120 may operate in an insulated state even without a negative bias applied thereto.

When a certain operating voltage is applied to the gate electrode 134 for operations of the first and second transistors TR1 and TR2, the oxide semiconductor layer 120 corresponding to the active region AR may operate as a channel region CH. For example, a portion of the oxide semiconductor layer 120 vertically overlapping the gate electrode 134 in the active region AR may function as a channel region CH of the first transistor TR1 or the second transistor TR2.

In the semiconductor device 10 according to an exemplary embodiment of the present inventive concept, the first and second transistors TR1 and TR2 may operate independently, by allowing the device isolation region IR substantially and electrically to maintain an insulated state between the active regions AR, while the process of forming the device isolation structure by etching the oxide semiconductor layer 120 is omitted. For example, the oxide semiconductor layer 120 according to the present exemplary embodiment may maintain an insulated state in the device isolation region IR, and at the same time may function as a channel region CH in the active region AR.

Because the fabricating process of the semiconductor device 10 according to the present inventive concept is simplified, there may be an effect that productivity and economic efficiency of the semiconductor device 10 are enhanced.

Figure 2:
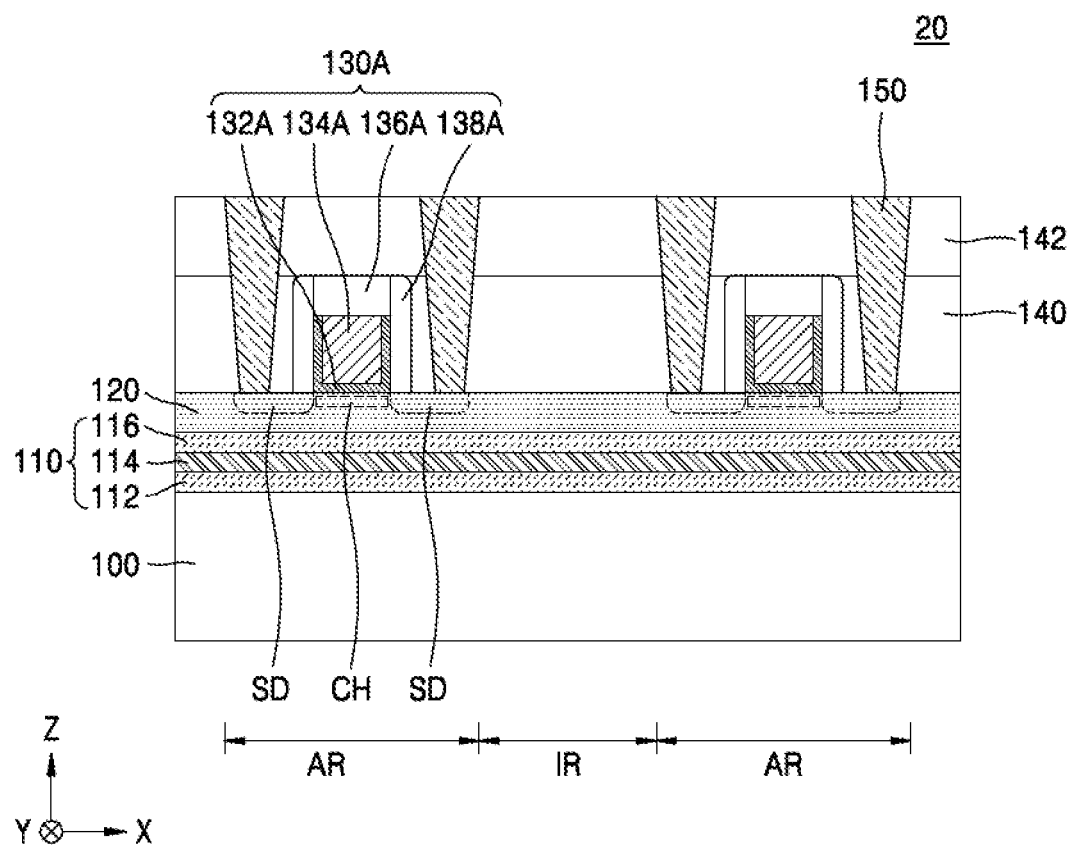
FIGS. 2 through 4 are drawings of semiconductor devices, each according to an exemplary embodiment of the present inventive concept.
Figure 3:
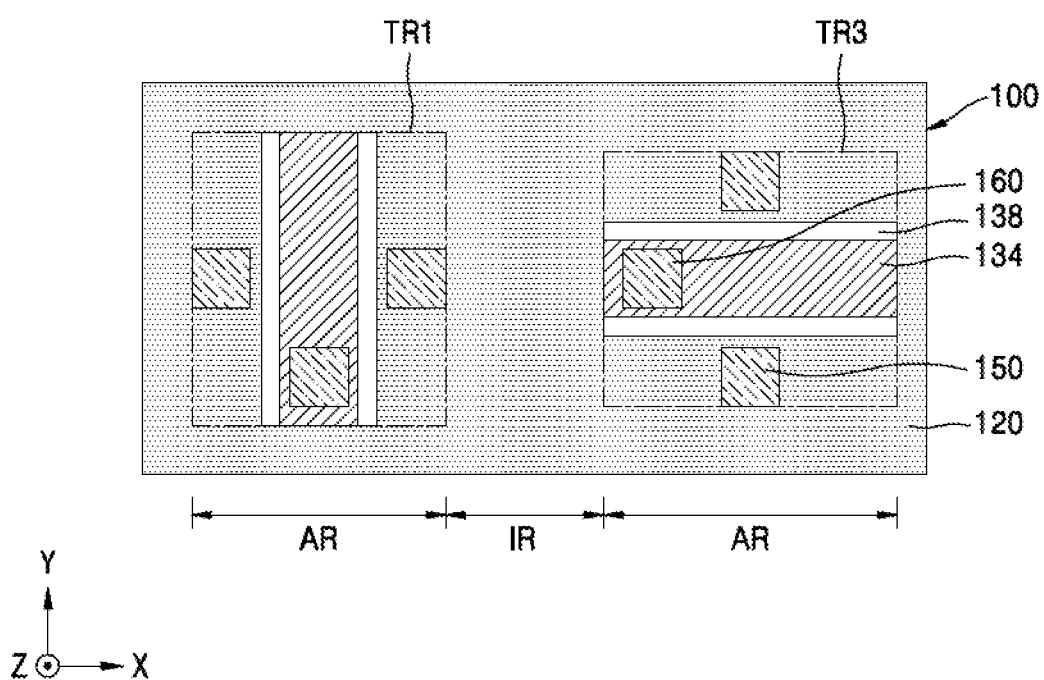
Figure 4:
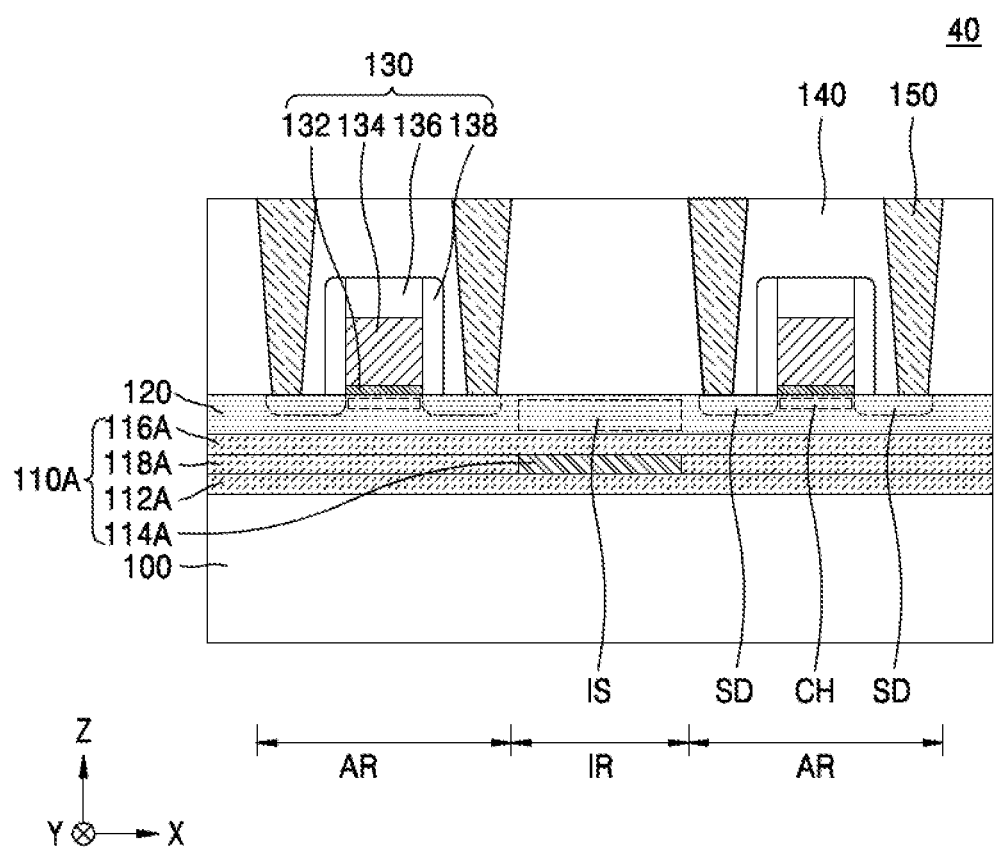

FIGS. 2 through 4 are drawings of semiconductor devices 20, 30, and 40, each according to an exemplary embodiment of the present inventive concept.

Most of the components constituting the semiconductor devices 20, 30, and 40 and materials constituting the components described below may be substantially the same as or similar to those described above with reference to FIGS. 1A and 1B. Accordingly, for convenience of description, differences from the semiconductor device (refer to 10 in FIG. 1B) described above are mainly described.

Referring to FIG. 2, the semiconductor device 20 may include the flat plate structure 110, the oxide semiconductor layer 120, a gate structure 130A, and the contact plug 150, that are disposed on the substrate 100.

The gate structure 130A may include a gate dielectric layer 132A, a gate electrode 134A, a gate capping layer 136A, and a gate spacer 138A. The gate dielectric layer 132A may surround both side surfaces and a bottom surface of the gate electrode 134A, and may be formed between the gate electrode 134A and the oxide semiconductor layer 120 and between the gate electrode 134A and the gate spacer 138A.

The gate electrode 134A may include at least one of, for example, a metal, metal nitride, or metal carbide. For example, the gate electrode 134A may include, for example, aluminum (Al), copper (Cu), titanium (Ti), tantalum (Ta), tungsten (W), molybdenum (Mo), tantalum nitride (TaN), nickel silicide (NiSi), cobalt silicide (CoSi), titanium nitride (TiN), tungsten nitride (WN), titanium aluminide (TiAl), titanium aluminum nitride (TiAlN), tantalum carbonitride (TaCN), tantalum carbide (TaC), tantalum silicon nitride (TaSiN), or a combination thereof, but, the present inventive concept is not limited thereto. In an exemplary embodiment of the present inventive concept, the gate electrode 134A may include a work function metal-containing layer and a gap-fill metal layer.

The work-function metal-containing layer may include at least one metal of, for example, titanium (Ti), tungsten (W), ruthenium (Ru), niobium (Nb), molybdenum (Mo), hafnium (Hf), nickel (Ni), cobalt (Co), platinum (Pt), ytterbium (Yb), terbium (Tb), dysprosium (Dy), erbium (Er) or palladium (Pd). Alternatively, the work-function metal-containing layer may include at least one of, for example, titanium nitride (TiN), tungsten nitride (WN), titanium aluminide (TiAl), titanium aluminum nitride (TiAlN), tantalum nitride (TaN), titanium carbide (TiC), tantalum carbide (TaC), titanium aluminum carbide (TiAlC), tantalum carbonitride (TaCN), tantalum silicon nitride (TaSiN), or a combination thereof. The gap-fill metal layer may include, for example, tungsten (W) or aluminum (Al). In an exemplary embodiment of the present inventive concept, the gate electrode 134A may have a stacked structure of, for example, TiAlC/TiN/W, TiN/TaN/TiAlC/TiN/W, or TiN/TaN/TiN/TiAlC/TiN/W, but the present inventive concept is not limited thereto.

The interlayer insulating layer 140 may have a top surface at a level the same as that of a top surface of the gate structure 130A. The interlayer insulating layer 140 may surround sidewalls of the gate spacer 138A.

In an exemplary embodiment of the present inventive concept, an upper interlayer insulating layer 142 may be further formed on the interlayer insulating layer 140 and the gate structure 130A, and the contact plug 150 may penetrate the upper interlayer insulating layer 142 and the interlayer insulating layer 140, and may be electrically connected to a top surface of the source/drain region SD. Because the fabricating process of the semiconductor device 20 according to the present exemplary embodiment is simplified, the productivity and economic efficiency of the semiconductor device 20 may be enhanced.

Referring to FIG. 3, the semiconductor device 30 may include the first transistor TR1 and a third transistor TR3, which are arranged on the substrate 100.

The active region AR may be defined in the oxide semiconductor layer 120. The oxide semiconductor layer 120 may include the active region AR constituting the first transistor TR1, and in addition, may include the active region AR constituting the third transistor TR3. The first transistor TR1 and the third transistor TR3 may be formed in different active regions AR, and may be separated by a device isolation region IR. For example, the first transistor TR1 may include an NMOS transistor, and the third transistor TR3 may include a PMOS transistor, but the present inventive concept is not limited thereto.

The semiconductor device 30 of the present inventive concept may not include physical components such as a device isolation structure (that is, a device isolation layer or a device isolation trench) in the device isolation region IR.

The first transistor TR1 and the third transistor TR3 may be arranged with enhanced degrees of freedom. In other words, because the device isolation structure for partitioning the active region AR is unnecessary, the first transistor TR1 and the third transistor TR3 may be freely arranged at desired positions. In FIG. 3, the first transistor TR1 and the third transistor TR3 are illustrated to be in directions perpendicular to each other, but the present inventive concept is not limited thereto. For example, the first transistor TR1 and the third transistor TR3 may be arranged at a certain angle rather than at a right angle. Because the fabricating process of the semiconductor device 30 according to the present exemplary embodiment is simplified, the productivity and economic efficiency of the semiconductor device 30 may be enhanced.

Referring to FIG. 4, the semiconductor device 40 may include a flat plate structure 110A, the oxide semiconductor layer 120, the gate structure 130, and the contact plug 150, which are disposed on the substrate 100.

The flat plate structure 110A may be formed on the substrate 100. The flat plate structure 110A may include a first insulating layer 112A, a lower gate metal layer 114A, a second insulating layer 116A, and a third insulating layer 118A.

Each of the first insulating layer 112A, the second insulating layer 116A, and the third insulating layer 118A may include at least one of, for example, silicon oxide ($SiO_2$), silicon nitride ($Si_3N_4$), or aluminum oxide ($Al_2O_3$). In an exemplary embodiment of the present inventive concept, the first insulating layer 112A, the second insulating layer 116A, or the third insulating layer 118A may function as a buffer for reducing stress caused by a lattice constant difference between a material constituting the substrate 100 and a material constituting the oxide semiconductor layer 120. In addition, the first insulating layer 112A, the second insulating layer 116A, or the third insulating layer 118A may prevent impurities such as hydrogen (H) atoms in the substrate 100 from diffusing into the oxide semiconductor layer 120, and may function as a barrier layer for preventing current flowing inside the oxide semiconductor layer 120 from leaking into the inside of the substrate 100. Since hydrogen (H) atoms may be included in silicon nitride ($Si_3N_4$) film, in an exemplary embodiment of the present inventive concept, the second insulating layer 116A in direct contact with the oxide semiconductor layer 120 may not include silicon nitride ($Si_3N_4$) and may include, for example, silicon oxide ($SiO_2$) and/or aluminum oxide ($Al_2O_3$). The second insulating layer 116A including silicon oxide ($SiO_2$) and/or aluminum oxide ($Al_2O_3$) may prevent or suppress an upward movement of any hydrogen (H) atoms into the oxide semiconductor layer 120.

Side surfaces of the lower gate metal layer 114A may be surrounded by the third insulating layer 118A, between the first insulating layer 112A and the second insulating layer 116A. The lower gate metal layer 114A may include, for example, doped polysilicon (p-Si), metal, metal nitride, metal silicide, or a combination thereof.

In an exemplary embodiment of the present inventive concept, the lower gate metal layer 114A may include at least one of, for example, nickel (Ni), cobalt (Co), or ruthenium (Ru). When a certain voltage is applied to the lower gate metal layer 114A via the lower gate metal layer contact (refer to 170 in FIG. 1B), an isolation region IS of the oxide semiconductor layer 120 corresponding to the lower gate metal layer 114A may operate in an insulated state.

The lower gate metal layer 114A may be formed only in the device isolation region IR of the substrate 100. In other words, the lower gate metal layer 114A may not be formed in the active region AR of the substrate 100. However, because the third insulating layer 118A is formed on the side surfaces of the lower gate metal layer 114A, a top surface of the flat plate structure 110A may be planar across the whole surface of the substrate 100 or across a plurality of active regions AR. Accordingly, although the oxide semiconductor layer 120 is formed without isolation, the active regions AR may be electrically isolated by applying a voltage onto the lower gate metal layer 114A located in the device isolation region IR of the substrate 100. Because the fabricating process of the semiconductor device 40 according to the present exemplary embodiment is simplified, the productivity and economic efficiency of the semiconductor device 40 may be enhanced.

Figure 5A:
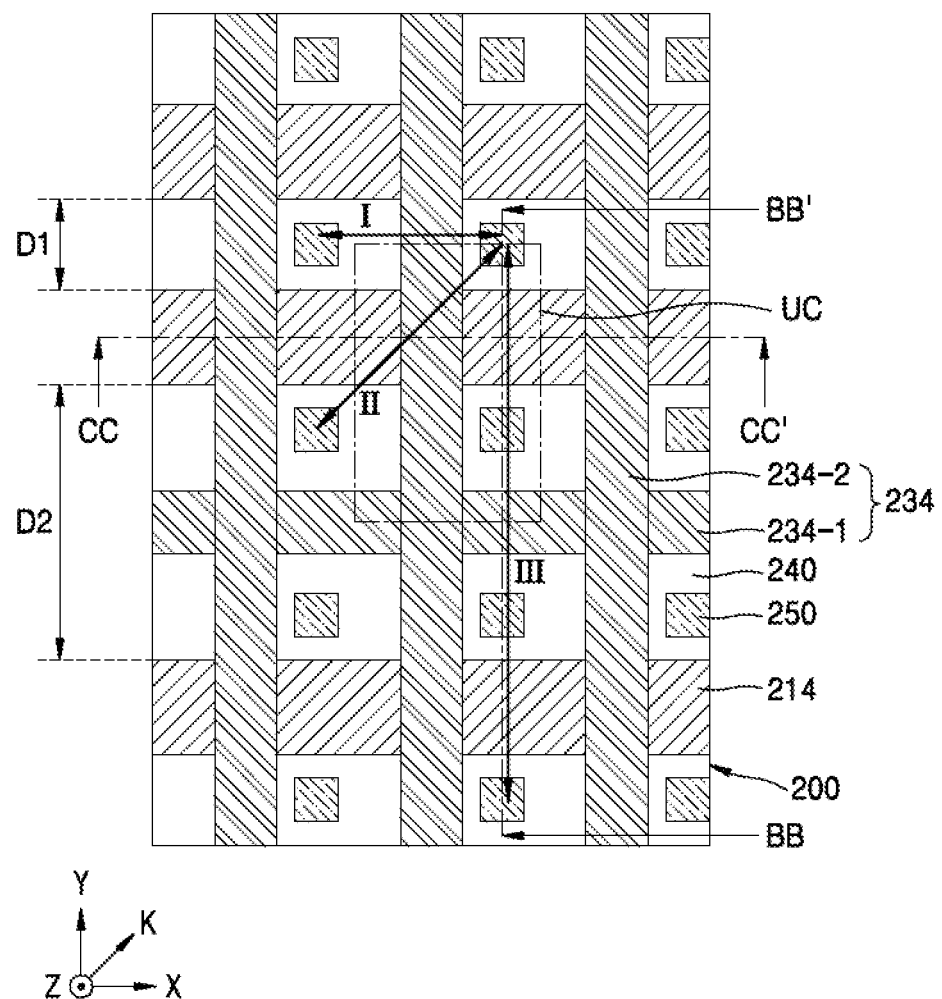
FIG. 5A is a plan view illustrating a semiconductor device according to an exemplary embodiment of the present inventive concept.
Figure 5B:
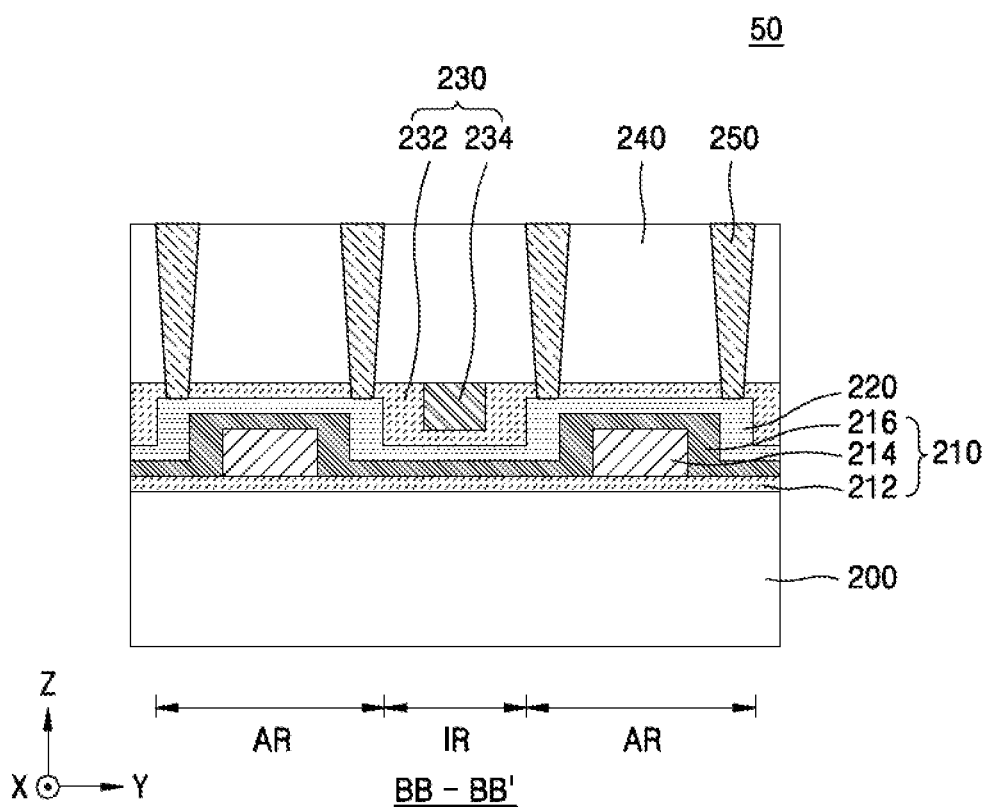
FIG. 5B is a cross-sectional view of the semiconductor device taken along line BB-BB' of FIG. 5A.
Figure 5C:
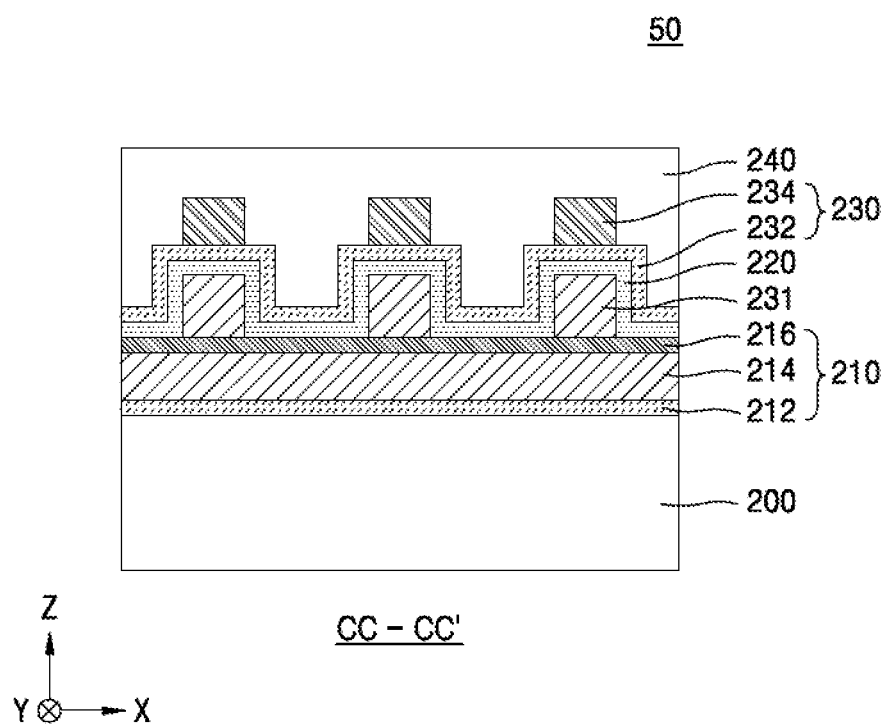
FIG. 5C is a cross-sectional view of the semiconductor device taken along line CC-CC' of FIG. 5A.

FIG. 5A is a plan view illustrating a semiconductor device 50 according to an exemplary embodiment of the present inventive concept, FIG. 5B is a cross-sectional view of the semiconductor device 50 taken along line BB-BB' of FIG. 5A, and FIG. 5C is a cross-sectional view of the semiconductor device 50 taken along line CC-CC' of FIG. 5A.

Referring to FIGS. 5A through 5C together, the semiconductor device 50 may include a gate structure 210, an oxide semiconductor layer 220, an upper structure 230, and a contact plug 250, which are disposed on a substrate 200.

The substrate 200 may include a wafer including silicon (Si), and may be substantially the same as the substrate described above (refer to 100 in FIG. 1B). The substrate 200 may include a conductive region, for example, a well doped with impurities, or a structure doped with impurities. In addition, the substrate 100 may include one or more semiconductor layers or structures, and may include active or operable portions of semiconductor devices.

The gate structure 210 may be formed on the substrate 200. The gate structure 210 may include a lower insulating layer 212, a gate electrode 214, and a gate dielectric layer 216.

The lower insulating layer 212 may include at least one of, for example, silicon oxide ($SiO_2$), silicon nitride ($Si_3N_4$), or aluminum oxide ($Al_2O_3$). For example, the lower insulating layer 212 may function as a buffer layer for reducing stress due to a lattice constant difference between a material constituting the substrate 200 and a material constituting the oxide semiconductor layer 220. In addition, the lower insulating layer 212 may prevent impurities such as hydrogen (H) atoms from diffusing into the oxide semiconductor layer 220 from the substrate 200, and may function as a barrier layer for preventing the current flowing inside the oxide semiconductor layer 220 from leaking into the substrate 200.

The gate electrode 214 may be formed on the lower insulating layer 212. The gate electrode 214 may include, for example, doped polysilicon (p-Si), a metal, or a combination thereof. The gate electrodes 214 may extend in the first direction (X direction), and may be spaced apart from each other in the second direction (Y direction). In other words, the gate electrode 214 may form a gate line.

In an exemplary embodiment of the present inventive concept, a plurality of gate electrodes 214 may include at least two of the gate electrodes 214 being adjacent to each other and having a first interval distance D1 in the second direction (Y direction), and at least two of the gate electrodes 214 being adjacent to each other and having a second interval distance D2 greater than the first distance D1. In other words, distances between the plurality of gate electrodes 214 may not be the same.

The gate dielectric layer 216 may conformally cover a top surface of the gate electrode 214. The gate dielectric layer 216 may include, for example, a silicon oxide ($SiO_2$) layer, a silicon oxynitride (SiON) layer, a high dielectric constant layer having a dielectric constant higher than that of the silicon oxide ($SiO_2$) layer, or a combination thereof. The high dielectric constant layer may include, for example, a metal oxide or a metal oxynitride. For example, the high dielectric constant layer usable as the gate dielectric layer 216 may include, for example, hafnium oxide ($HfO_2$), hafnium silicon oxide (HfSiO), hafnium silicon oxynitride (HfSiON), hafnium tantalum oxide (HMO), hafnium titanium oxide (HMO), hafnium zirconium oxide (HfZrO), hafnium aluminum oxide (HfAlO), zirconium oxide ($ZrO_2$), titanium oxide ($TiO_2$), yttrium oxide ($Y_2O_3$), tantalum oxide ($Ta_2O_5$), lanthanum oxide ($La_2O_3$), lanthanum aluminum oxide (LaAlO), lanthanum hafnium oxide (LaHfO), aluminum oxide ($Al_2O_3$), or a combination thereof, but the present inventive concept is not limited thereto.

The oxide semiconductor layer 220 may conformally cover the gate dielectric layer 216 of the gate structure 210. A level of a top surface of the oxide semiconductor layer 220 may be higher than a level of a top surface of the substrate 200. A material constituting the oxide semiconductor layer 220 may be substantially the same as that of the oxide semiconductor layer described above (refer to 120 in FIG. 1B).

The active region AR may be defined in the oxide semiconductor layer 220. The oxide semiconductor layer 220 may include the active region AR constituting an NMOS transistor, and in addition, may include the active region AR constituting a PMOS transistor. For example, the NMOS transistor and the PMOS transistor may be formed in different active regions AR separated by the device isolation region IR.

The top surfaces of the oxide semiconductor layer 220 may have an uneven structure, and may be continuously connected to each other on an upper portion of the whole surface of the substrate 200 or in the plurality of active regions AR. In other words, the oxide semiconductor layer 220 may be formed without a breakage across the active region AR and the device isolation region IR of the substrate 200.

The semiconductor device 50 of the present inventive concept may not include physical components such as a device isolation structure (for example, a device isolation layer or a device isolation trench) in the device isolation region IR. Instead, when a certain voltage is applied to the upper gate metal layer 234, the oxide semiconductor layer 220 may operate in a locally insulated state.

The upper structure 230 may be formed on the oxide semiconductor layer 220. The upper structure 230 may include an upper insulating layer 232 and an upper gate metal layer 234.

The upper insulating layer 232 may conformally cover the oxide semiconductor layer 220, and may include at least one of, for example, silicon oxide ($SiO_2$), silicon nitride ($Si_3N_4$), or aluminum oxide ($Al_2O_3$). The upper insulating layer 232 may have a top surface of an uneven structure, and a level of the top surface of the upper insulating layer 232 may be higher than a level of the top surface of the substrate 200.

The upper gate metal layer 234 may be formed on the upper insulating layer 232, and may include, for example, doped polysilicon (p-Si), metal, metal nitride, metal silicide, or a combination thereof. In an exemplary embodiment of the present inventive concept, the upper gate metal layer 234 may include at least one of, for example, nickel (Ni), cobalt (Co), or ruthenium (Ru). When a certain voltage is applied to the upper gate metal layer 234, the oxide semiconductor layer 220 may operate in a locally insulated state.

The upper gate metal layer 234 may be formed only in the device isolation region IR of the substrate 200. In other words, the upper gate metal layer 234 may not be formed in the active region AR of the substrate 200. For example, the upper gate metal layer 234 may be formed between each adjacent two of a plurality of active regions AR, and a device isolation insulating layer may not be formed between each adjacent two of the plurality of active regions AR.

In an exemplary embodiment of the present inventive concept, the upper gate metal layer 234 may include a first upper gate metal layer 234-1 formed between the gate electrodes 214, and a second upper gate metal layer 234-2 formed on a blocking insulating layer 231.

The first upper gate metal layers 234-1 may extend in the first direction (X direction), and may be spaced apart from each other in the second direction (Y direction). In addition, the second upper gate metal layers 234-2 may extend in the second direction (Y direction), and may be apart from each other in the first direction (X direction). In other words, the first upper gate metal layer 234-1 and the second upper gate metal layer 234-2 may perpendicularly cross each other.

In an exemplary embodiment of the present inventive concept, a level of a top surface of the first upper gate metal layer 234-1 may be lower than a level of a bottom surface of the second upper gate metal layer 234-2. This may be because the second upper gate metal layer 234-2 is arranged on the blocking insulating layer 231 having a certain thickness. For example, the second upper gate metal layer 234-2 may vertically overlap the blocking insulating layer 231.

The blocking insulating layer 231 may include at least one of, for example, silicon oxide ($SiO_2$), silicon nitride ($Si_3N_4$), or aluminum oxide ($Al_2O_3$). The blocking insulating layers 231 may extend in the second direction (Y direction), and may be spaced apart from each other in the first direction (X direction). In other words, the blocking insulating layer 231 and the gate electrode 214 may perpendicularly cross each other. The blocking insulating layer 231 may be arranged between each adjacent two, which are arranged in the first direction (X direction), of a plurality of contact plugs 250 on the gate dielectric layer 216.

The interlayer insulating layer 240 may cover the upper structure 230, and may include, for example, silicon oxide ($SiO_2$), silicon nitride ($Si_3N_4$), silicon oxynitride (SiON), tetraethyl orthosilicate (TEOS), or a low dielectric material having a low dielectric constant of about 2.2 to about 2.4. As an example, the low-k dielectric material may include carbon-doped silicon oxide, such as SiCOH.

The contact plug 250 may penetrate the interlayer insulating layer 240 and the upper insulating layer 232, and may be electrically connected to the oxide semiconductor layer 220. The contact plug 250 may include, for example, doped polysilicon (p-Si), metal, metal nitride, metal silicide, or a combination thereof. A material constituting the contact plug 250 may be substantially the same as that of the contact plug described above (refer to 150 in FIG. 1B). A level of a bottom surface of the contact plug 250 may be higher than a level of the top surface of the gate electrode 214. The contact plug 250 or the contact plug 150 may also be referred to as a contact structure.

Detailed descriptions are given on an insulation mechanism that operates between transistors in areas which are between neighboring unit cells UC constituting the semiconductor device 50.

In an interval I between transistors between neighboring unit cells UC in the first direction (X direction), device isolation may be possible by using a locally isolated state of the oxide semiconductor layer 220 due to an existence of the blocking insulating layer 231 and an operation of the upper structure 230. For example, when a certain voltage is applied to the second upper gate metal layer 234-2, the oxide semiconductor layer 220 may operate in a locally insulated state to isolate the neighboring unit cells UC in the first direction (X direction).

In an interval II between transistors between neighboring unit cells UC in a fourth direction (K direction), the device isolation may be possible by using the locally isolated state of the oxide semiconductor layer 220 due to the existence of the blocking insulating layer 231 and the operation of the upper structure 230. For example, when a certain voltage is applied to the second upper gate metal layer 234-2, the oxide semiconductor layer 220 may operate in a locally insulated state to isolate the neighboring unit cells UC in the fourth direction (K direction).

In an interval III between transistors between neighboring unit cells UC in the second direction (Y direction), the device isolation may be possible by using the locally isolated state of the oxide semiconductor layer 220 due to an arrangement of the gate electrode 214 and the operation of the upper structure 230. For example, when a certain voltage is applied to the first upper gate metal layer 234-1, the oxide semiconductor layer 220 may operate in a locally insulated state to isolate the neighboring unit cells UC in the second direction (Y direction).

Among transistors between the neighboring unit cells UC located in all directions, the device isolation may be possible by using the locally insulated state of the oxide semiconductor layer 220.

The semiconductor device 50 according to an exemplary embodiment of the present inventive concept may provide a structure capable of electrically being insulated between transistors between the unit cells UC without etching the oxide semiconductor layer 220. In other words, when a certain negative bias is applied to the oxide semiconductor layer 220 via the upper gate metal layer 234 of the upper structure 230, the oxide semiconductor layer 220 may operate as an insulating material like the silicon oxide ($SiO_2$). Accordingly, an array structure having the same feature size as a general semiconductor device that does not use the oxide semiconductor layer 220 may be implemented.

The negative bias may be applied to the oxide semiconductor layer 220 via the upper gate metal layer 234 of the upper structure 230. When a voltage of about −0.5 V to about −1 V, for example, about −0.7 V, is applied to the oxide semiconductor layer 220 via the upper gate metal layer 234, the oxide semiconductor layer 220 may operate in the insulated state.

In the semiconductor device 50 according to an exemplary embodiment of the present inventive concept, each transistor may operate independently by electrically maintaining the isolated state substantially between the transistors between the unit cells UC while a process of forming the device isolation structure by etching the oxide semiconductor layer 220 is omitted. For example, the oxide semiconductor layer 120 according to the present exemplary embodiment may maintain an insulated state in the device isolation region IR, and at the same time may function as a channel region CH of the transistor for the unit cell UC in the active region AR.

Because the fabricating process of the semiconductor device 50 may be simplified, there may be an effect that productivity and economic efficiency of the semiconductor device 50 are enhanced.

Figure 6:
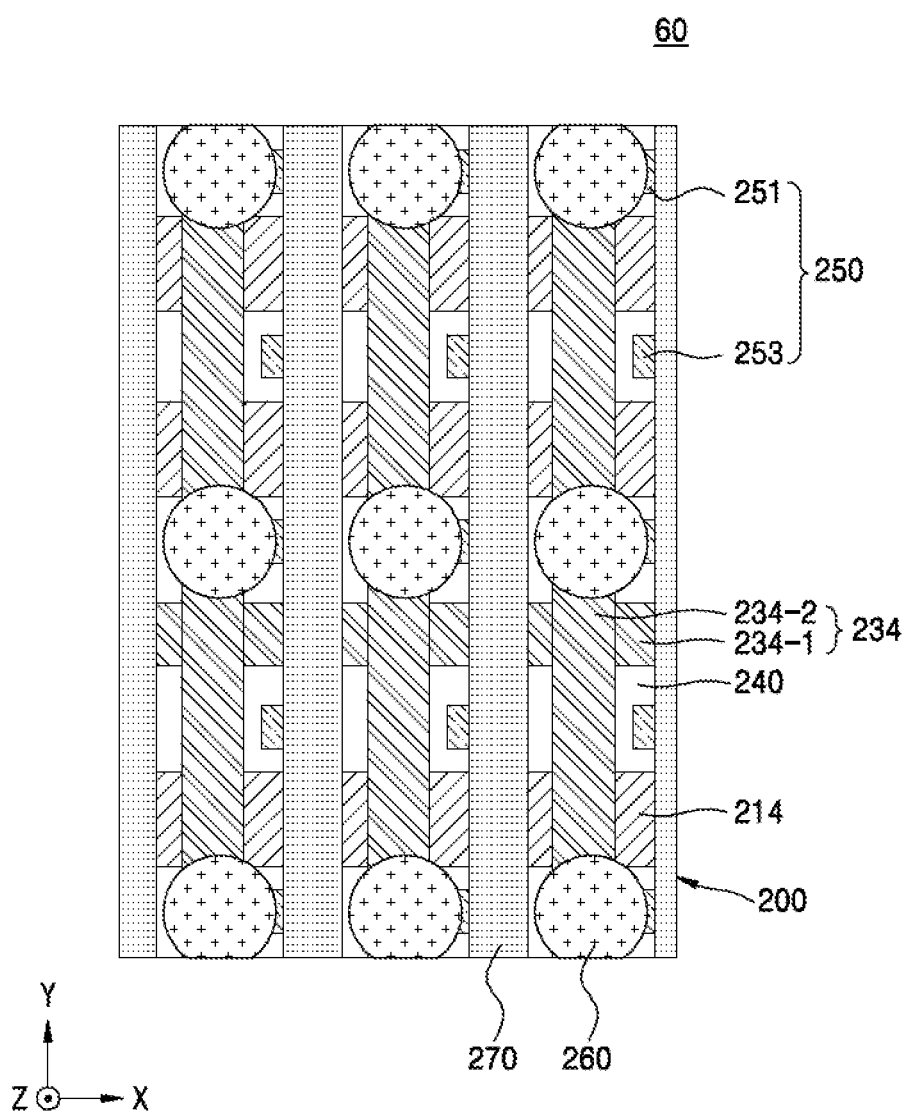
FIGS. 6 through 8 are drawings of semiconductor devices, each according to an exemplary embodiment of the present inventive concept.
Figure 7:
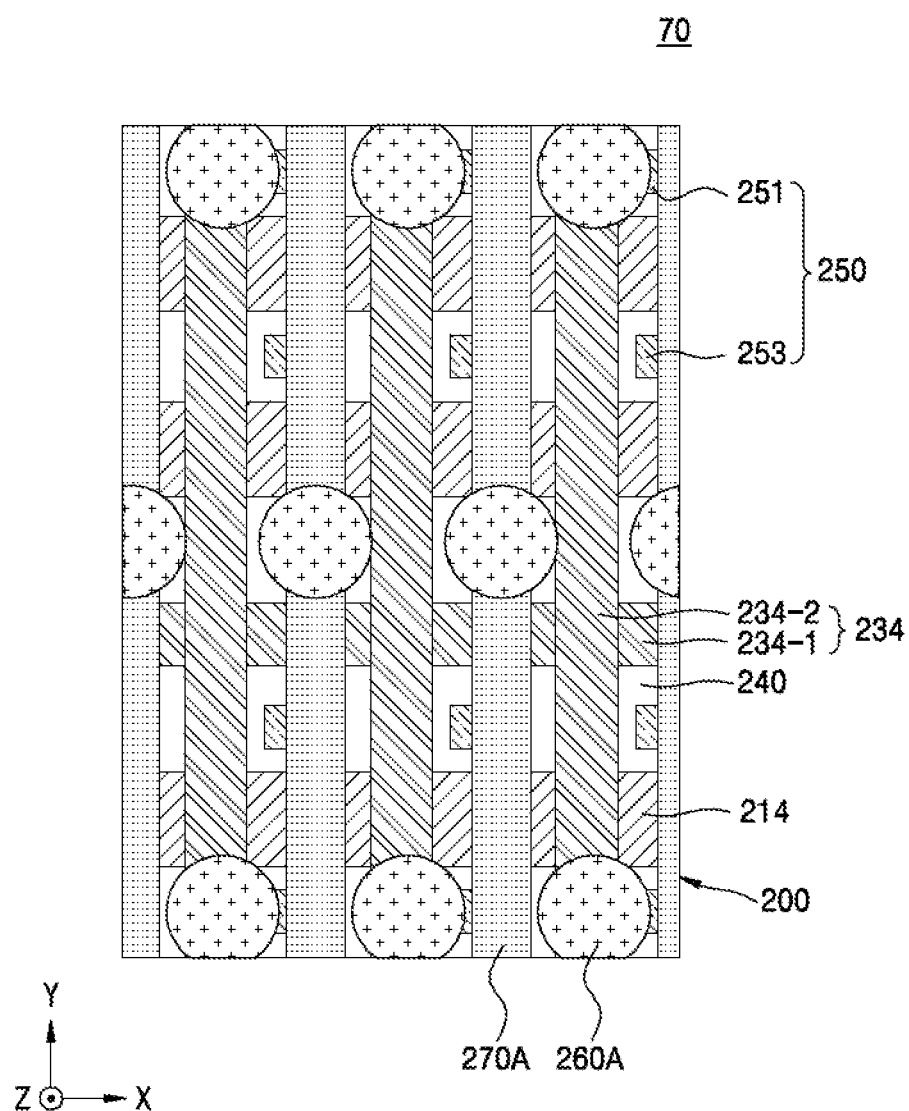
Figure 8:
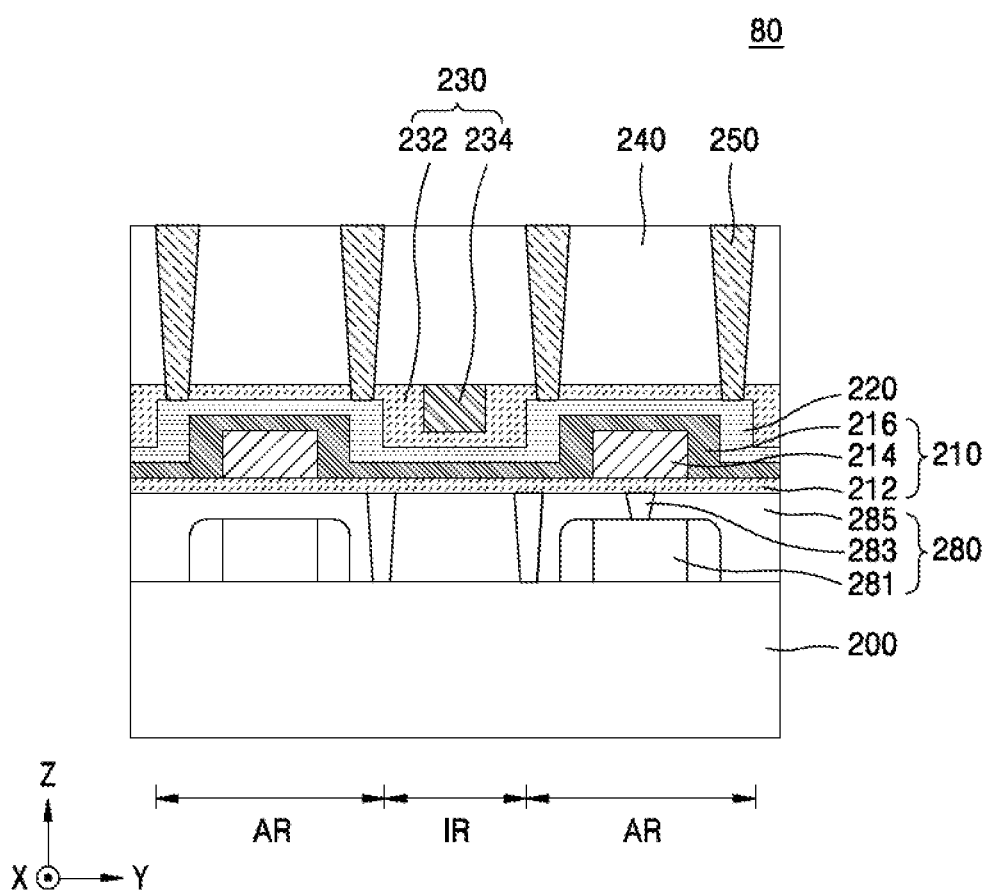

FIGS. 6 through 8 are drawings of semiconductor devices 60, 70, and 80, each according to an exemplary embodiment of the present inventive concept.

Most of components constituting the semiconductor devices 60, 70, and 80 described below and materials constituting the most of components may be substantially the same as or similar to those described with reference to FIGS. 5A through 5C. Accordingly, for convenience of description, descriptions focused on differences from the semiconductor device described above (refer to 50 of FIG. 5A) are given.

Referring to FIG. 6, the semiconductor device 60 may include a contact plug 250, a capacitor 260, and a bit line 270.

The contact plug 250 may include a first contact plug 251 connected to the capacitor 260 and a second contact plug 253 connected to the bit line 270.

The capacitor 260 may form a storage electrode in a cylindrical structure for increasing capacitance, and may be arranged in a line in the second direction (Y direction).

A plurality of bit lines 270 may extend in parallel with each other in the second direction (Y direction). A plurality of capacitors 260 may be located between two bit lines 270 adjacent to each other among the plurality of bit lines 270. The bit lines 270 may extend in parallel with the second upper gate metal layers 234-2, and may cross the first upper gate metal layer 234-1.

Referring to FIG. 7, the semiconductor device 70 may include the contact plug 250, a capacitor 260A, and a bit line 270A.

The contact plug 250 may include the first contact plug 251 connected to the capacitor 260A and the second contact plug 253 connected to the bit line 270A.

The capacitor 260A may include a storage electrode in a cylindrical structure to increase static capacitance. The capacitor 260A may be arranged in a zigzag manner in the second direction (Y direction). In other words, the capacitor 260A may be arranged in a honeycomb structure.

A plurality of bit lines 270A may extend in parallel with each other in the second direction (Y direction). A plurality of capacitors 260A may be formed between two adjacent bit lines 270A among the plurality of bit lines 270A, and on the bit lines 270A. In this case, an insulating layer may be formed between the capacitor 260A and the bit line 270A. The bit lines 270A may extend in parallel with the second upper gate metal layers 234-2, and may cross the first upper gate metal layer 234-1.

Referring to FIG. 8, the semiconductor device 80 may include the gate structure 210, the oxide semiconductor layer 220, the upper structure 230, the contact plug 250, and a driving circuit region 280, which are disposed on the substrate 200.

The driving circuit region 280 may be a region in which peripheral circuits or driving circuits for driving the semiconductor device 80 are arranged. The driving circuit region 280 may be formed between the substrate 200 and the gate structure 210.

In an exemplary embodiment of the present inventive concept, the peripheral circuits in the driving circuit region 280 may include circuits capable of processing data input/output to/from the semiconductor device 80 at a high speed. The driving circuit region 280 may include a wiring structure 283 electrically connected to a plurality of transistors 281. The wiring structure 283 may be insulated by an interlayer insulating layer 285 formed in the driving circuit region 280.

The semiconductor device 80 of the present inventive concept may not include physical components such as a device isolation structure (for example, a device isolation layer or a device isolation trench) in the device isolation region IR. Instead, when a certain voltage is applied to the upper gate metal layer 234, the oxide semiconductor layer 220 may operate in a locally insulated state. Because the fabricating process of the semiconductor device 80 according to the present exemplary embodiment is simplified, the productivity and economic efficiency of the semiconductor device 80 may be enhanced.

Figure 9:
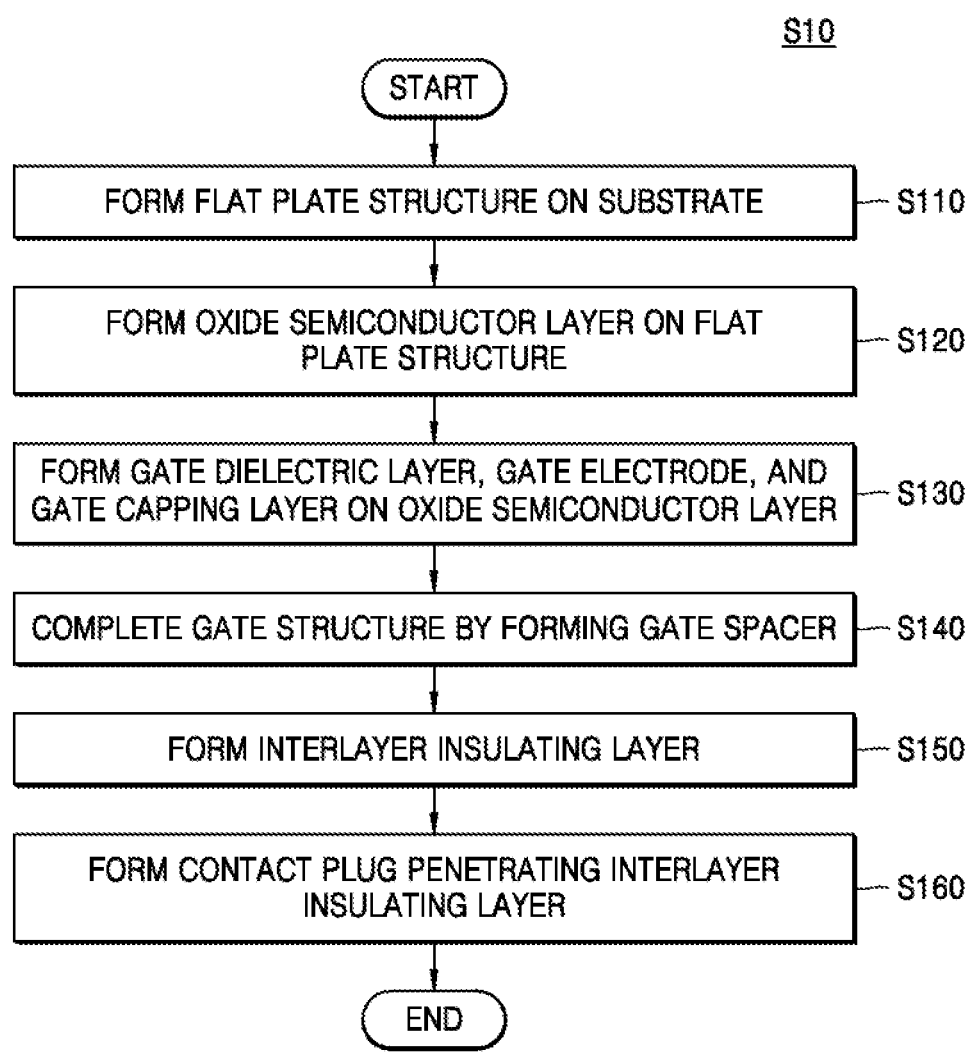
FIG. 9 is a flowchart of a method of fabricating a semiconductor device, according to an exemplary embodiment of the present inventive concept.

FIG. 9 is a flowchart of a method S10 of fabricating a semiconductor device, according to an exemplary embodiment of the present inventive concept.

Referring to FIG. 9, the method S10 of fabricating the semiconductor device may include a process sequence of six operations (S110 through S160).

When a certain exemplary embodiment is implemented differently, a particular process order may be executed differently from the order to be described. For example, two consecutively described processes may be substantially performed at the same time or in an order opposite to the described order. This flexibility may also be applied to a method (refer to S20 of FIG. 11) of fabricating a semiconductor device, which is described later.

The method S10 of fabricating the semiconductor device according to an exemplary embodiment of the present inventive concept may include: first operation of forming a flat plate structure on a substrate (S110), second operation of forming an oxide semiconductor layer on the flat plate structure (S120), third operation of forming a gate dielectric layer, a gate electrode, and a gate capping layer on the oxide semiconductor layer (S130), fourth operation of completing a gate structure by forming a gate spacer (S140), fifth operation of forming an interlayer insulating layer (S150), and sixth operation of forming a contact plug penetrating the interlayer insulating layer (S160).

Technical characteristics of each of first through sixth operations S110 through S160 is described later in detail with reference to FIGS. 10A through 10E.

FIGS. 10A through 10E are cross-sectional views illustrating a method of manufacturing a semiconductor device according to a process sequence, according to an exemplary embodiment of the present inventive concept. Each of FIGS. 10A through 10E may respectively illustrate each of first through sixth operations S110 through S160 of FIG. 9.

Figure 10A:
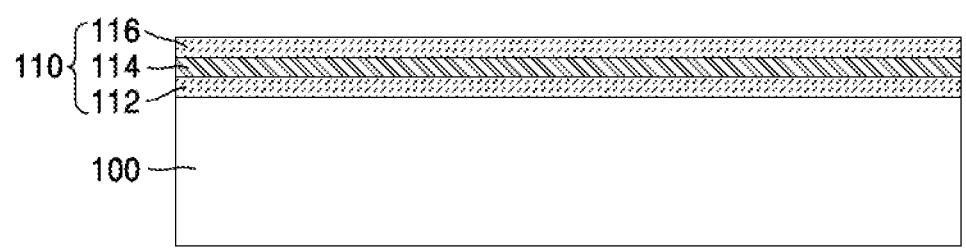
FIGS. 10A through 10E are cross-sectional views illustrating a method of fabricating a semiconductor device according to a process sequence, according to an exemplary embodiment of the present inventive concept.
Figure 10A:

Referring to FIG. 10A, the flat plate structure 110 may be formed on the substrate 100 in which the plurality of active regions AR are defined.

The flat plate structure 110 may include the first insulating layer 112, the lower gate metal layer 114, and the second insulating layer 116.

The first insulating layer 112 may be formed on the substrate 100, and may include, for example, silicon oxide ($SiO_2$), silicon nitride ($Si_3N_4$), or aluminum oxide ($Al_2O_3$). The first insulating layer 112 may be formed by, for example, a chemical vapor deposition (CVD) process, a thermal oxidation process, an atomic layer deposition (ALD) process, or the like.

The lower gate metal layer 114 may be formed on the first insulating layer 112, and may include, for example, doped polysilicon (p-Si), metal, metal nitride, metal silicide, or a combination thereof. In an exemplary embodiment of the present inventive concept, the lower gate metal layer 114 may include at least one of, for example, nickel (Ni), cobalt (Co), or ruthenium (Ru). The lower gate metal layer 114 may be formed by a CVD process or a physical vapor deposition (PVD) process.

The second insulating layer 116 may be formed on the lower gate metal layer 114, and may include, substantially like the first insulating layer 112, for example, silicon oxide ($SiO_2$), silicon nitride ($Si_3N_4$), or aluminum oxide ($Al_2O_3$). The second insulating layer 116 may be formed by a CVD process, a thermal oxidation process, an ALD process, or the like.

Figure 10B:
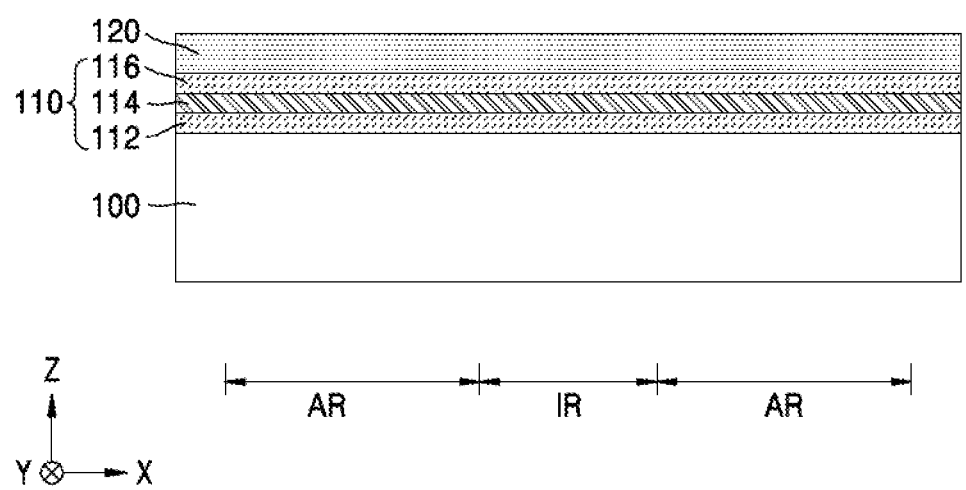

Referring to FIG. 10B, the oxide semiconductor layer 120 may be formed on the flat plate structure 110.

The oxide semiconductor layer 120 may include at least one of, for example, indium gallium zinc oxide (InGaZnO), indium gallium silicon oxide (InGaSiO), indium tin zinc oxide (InSnZnO), indium zinc oxide (InZnO), or hafnium indium zinc oxide (HfInZnO). The oxide semiconductor layer 120 may be formed by, for example, a PVD process, a pulsed laser deposition (PLD) process, a CVD process, an ADL process, or the like.

The oxide semiconductor layer 120 may have an amorphous or c-axis aligned crystal structure. In an exemplary embodiment of the present inventive concept, a laser annealing process for crystallizing the oxide semiconductor layer 120 may be additionally performed. In an exemplary embodiment of the present inventive concept, impurities may be doped onto the oxide semiconductor layer 120. For example, to dope impurities onto the oxide semiconductor layer 120, impurities may be doped in-situ in a process of forming the oxide semiconductor layer 120, or impurity ions may be ion implanted after the oxide semiconductor layer 120 is formed. In an exemplary embodiment of the present inventive concept, at least one impurity of, for example, fluorine (F), hydrogen (H), nitrogen (N), magnesium (Mg), yttrium (Y), ruthenium (Ru), or arsenic (As) may be doped in the oxide semiconductor layer 120.

Figure 10C:
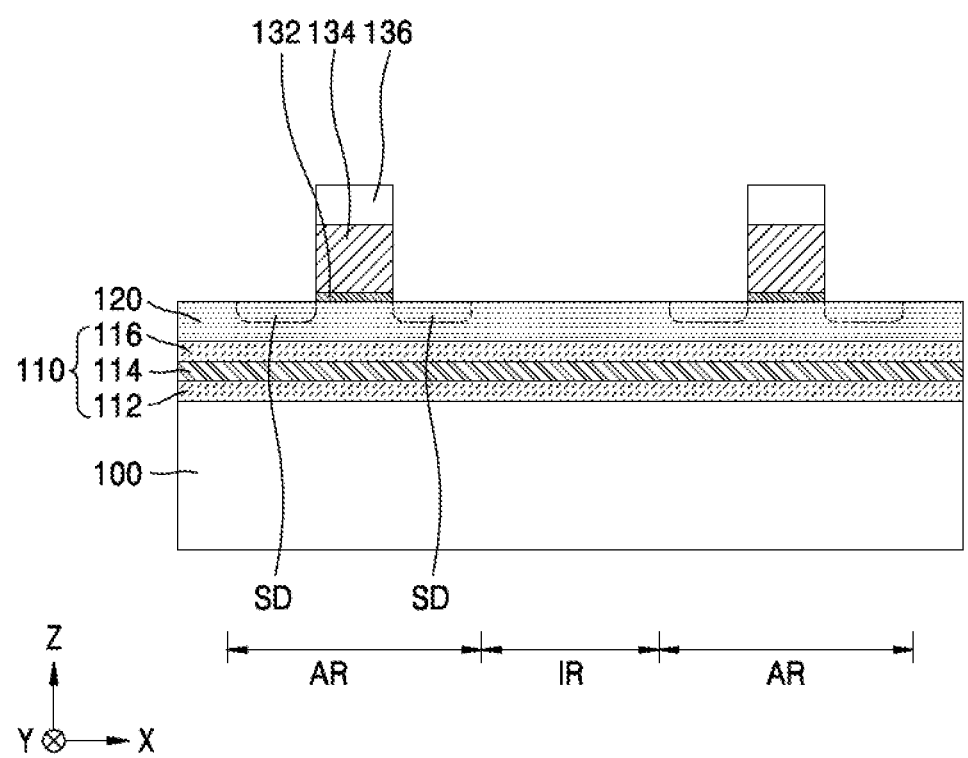

Referring to FIG. 10C, after a gate insulating layer, a gate conductive layer, and the gate capping layer 136 are sequentially formed on the oxide semiconductor layer 120, the gate electrode 134 and the gate dielectric layer 132 may be formed by using the gate capping layer 136 as an etching mask, and patterning the gate conductive layer and the gate insulating layer.

The source/drain region SD may be formed inside the oxide semiconductor layer 120 on both sides of the gate dielectric layer 132, the gate electrode 134, and the gate capping layer 136. The source/drain region SD may be formed by implanting impurity ions onto the oxide semiconductor layer 120. For example, a p-type impurity or an n-type impurity may be doped in the source/drain region SD. In an exemplary embodiment of the present inventive concept, an impurity ion implantation process may be performed to form the source/drain region SD after the gate spacer (refer to 138 in FIG. 10D) is formed.

Figure 10D:
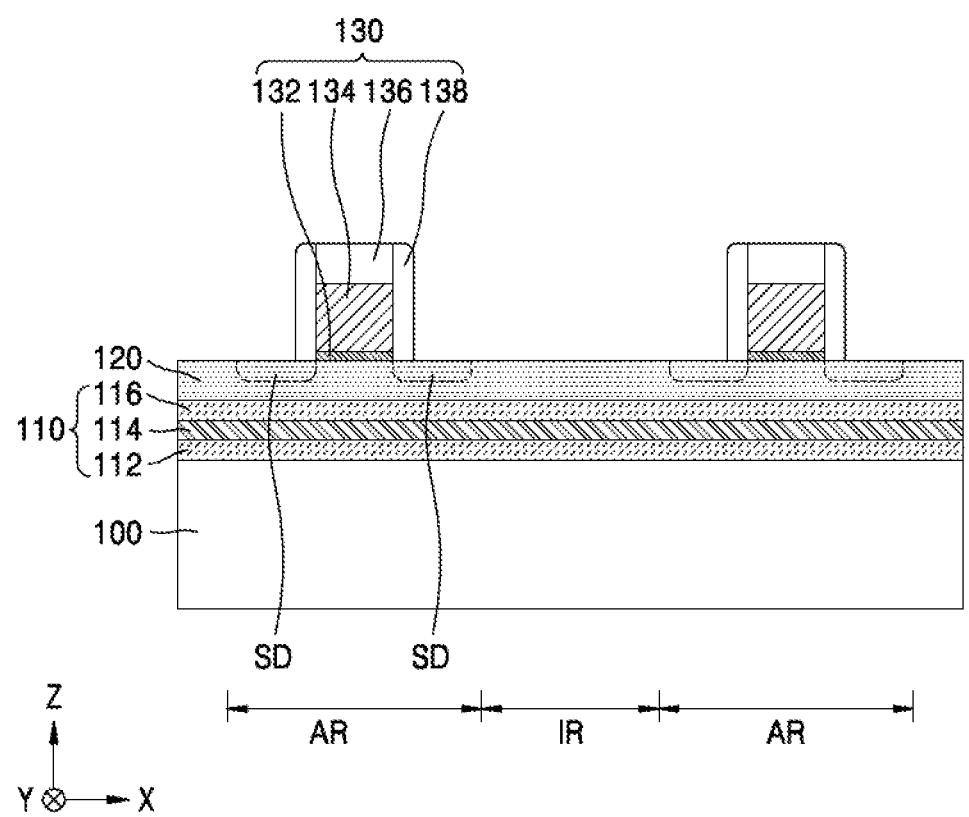

Referring to FIG. 10D, the gate spacers 138 may be formed on both sidewalls of the gate dielectric layer 132, the gate electrode 134, and the gate capping layer 136.

A spacer insulating layer covering the gate dielectric layer 132, the gate electrode 134, and the gate capping layer 136 may be formed by a CVD process or an ALD process, and the gate spacer 138 may be formed by performing an anisotropic etching process on the spacer insulation layer. For example, the gate spacer 138 may include silicon nitride ($Si_3N_4$), but the present inventive concept is not limited thereto. The gate spacer 138 may include multiple layers including different materials from each other. For example, an air gap may be formed in the gate spacer 138 having multilayers.

Here, the gate dielectric layer 132, the gate electrode 134, the gate capping layer 136, and the gate spacer 138 may be referred to as components of the gate structure 130.

Figure 10E:
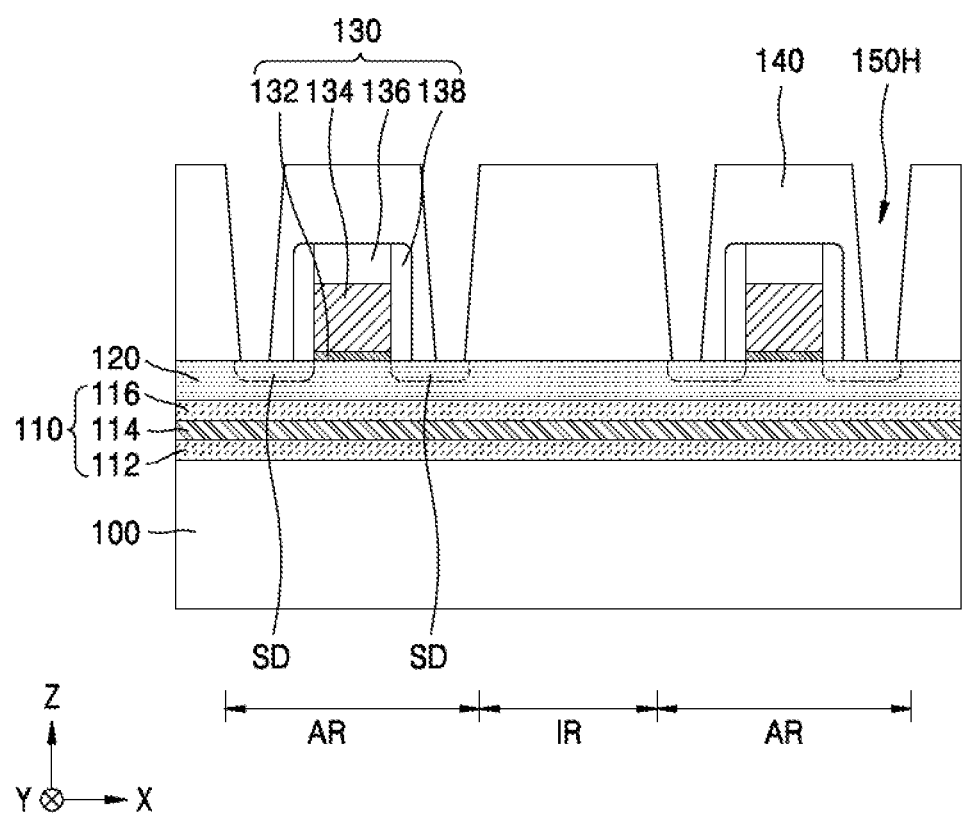

Referring to FIG. 10E, an interlayer insulating layer 140 may be formed on the oxide semiconductor layer 120 and the gate structure 130.

The interlayer insulating layer 240 may include, for example, silicon oxide ($SiO_2$), silicon nitride ($Si_3N_4$), silicon oxynitride (SiON), tetraethyl orthosilicate (TEOS), or a low dielectric material. As an example, the low-k dielectric material may include carbon-doped silicon oxide, such as SiCOH. By forming a mask pattern on the interlayer insulating layer 140 and using the mask pattern as an etching mask, a contact hole 150H that penetrates the interlayer insulating layer 140 and exposes the top surface of the source/drain region SD may be formed.

The mask pattern may be formed on the interlayer insulating layer 140 by a lithography process. By applying a photoresist and patterning the photoresist through exposure and development processes, the mask pattern may be formed. In this case, the contact hole 150H may be defined by the mask pattern.

Recently, as the design rules which define the minimum feature sizes and spaces are reduced below a limit of a general photolithography process, a new process using an extreme ultraviolet (EUV) ray may be introduced. Accordingly, the mask pattern may be formed by a process using the EUV ray.

By etching the interlayer insulating layer 140 using the mask pattern as an etch mask, the contact hole 150H exposing a portion of the top surface of the source/drain region SD may be formed. The contact hole 150H may have a tapered profile in which an upper width is greater than a lower width.

Referring again to FIG. 1B, by forming a conductive layer filling the contact hole 150H on the interlayer insulating layer 140, and removing an upper portion of the conductive layer by a chemical mechanical polishing (CMP) process until the top surface of the interlayer insulating layer 140 is exposed, the contact plug 150 filling the contact hole 150H may be formed. The contact plug 150 may include, for example, doped polysilicon (p-Si), metal, metal nitride, metal silicide, or a combination thereof.

By using such a fabricating process, the semiconductor device 10 according to an exemplary embodiment of the present inventive concept may be fabricated, and because the fabricating process of the semiconductor device 10 is simplified, the productivity and economic efficiency of the semiconductor device 10 may be enhanced.

The fabricating processes of the other semiconductor devices 20, 30, and 40 may be readily understood by those of ordinary skill in the art with reference to the fabricating process of the semiconductor device 10 described above.

Figure 11:
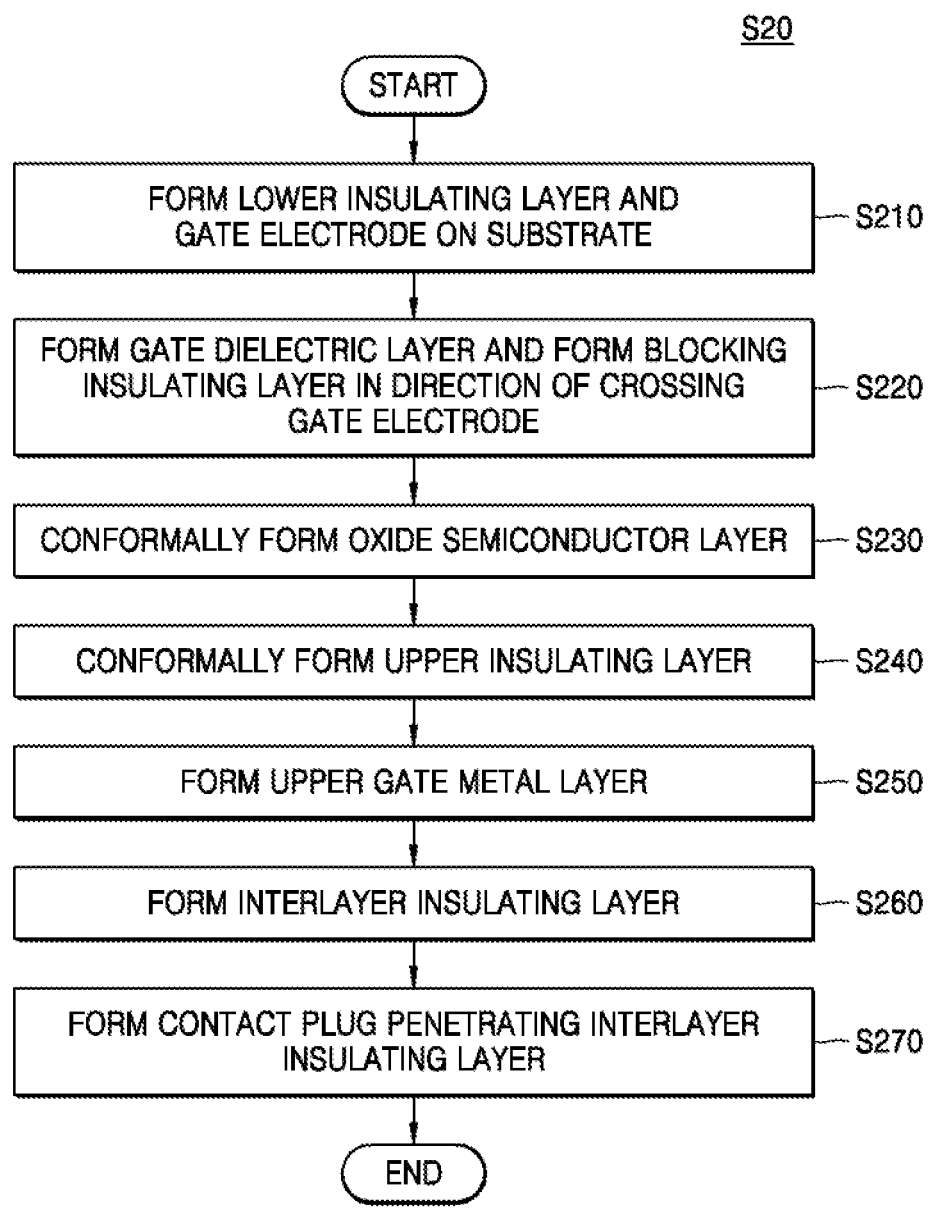
FIG. 11 is a flowchart of a method of fabricating a semiconductor device, according to an exemplary embodiment of the present inventive concept.

FIG. 11 is a flowchart of a method (S20) of fabricating a semiconductor device, according to an exemplary embodiment of the present inventive concept.

Referring to FIG. 11, the method S20 of fabricating a semiconductor device may include a process sequence of seven operations (S210 through S270).

The method (S20) of fabricating a semiconductor device according to an exemplary embodiment of the present inventive concept may include first operation (S210) of forming a lower insulating layer and a gate electrode on a substrate, second operation (S220) of forming a gate dielectric layer and forming a blocking insulating layer in a direction to cross the gate electrode, third operation (S230) of conformally forming an oxide semiconductor layer, fourth operation (S240) of conformally forming an upper insulating layer, fifth operation (S250) of forming an upper gate metal layer, sixth operation (S260) of forming an interlayer insulating layer, and seventh operation (S270) of forming a contact plug penetrating the interlayer insulating layer.

Technical characteristics of each of first through seventh operations S210 through S270 are described in detail with reference to FIGS. 12A through 17C.

FIGS. 12A through 17C are drawings illustrating a method of fabricating a semiconductor device according to a process sequence, according to an exemplary embodiment of the present inventive concept.

Figure 12A:
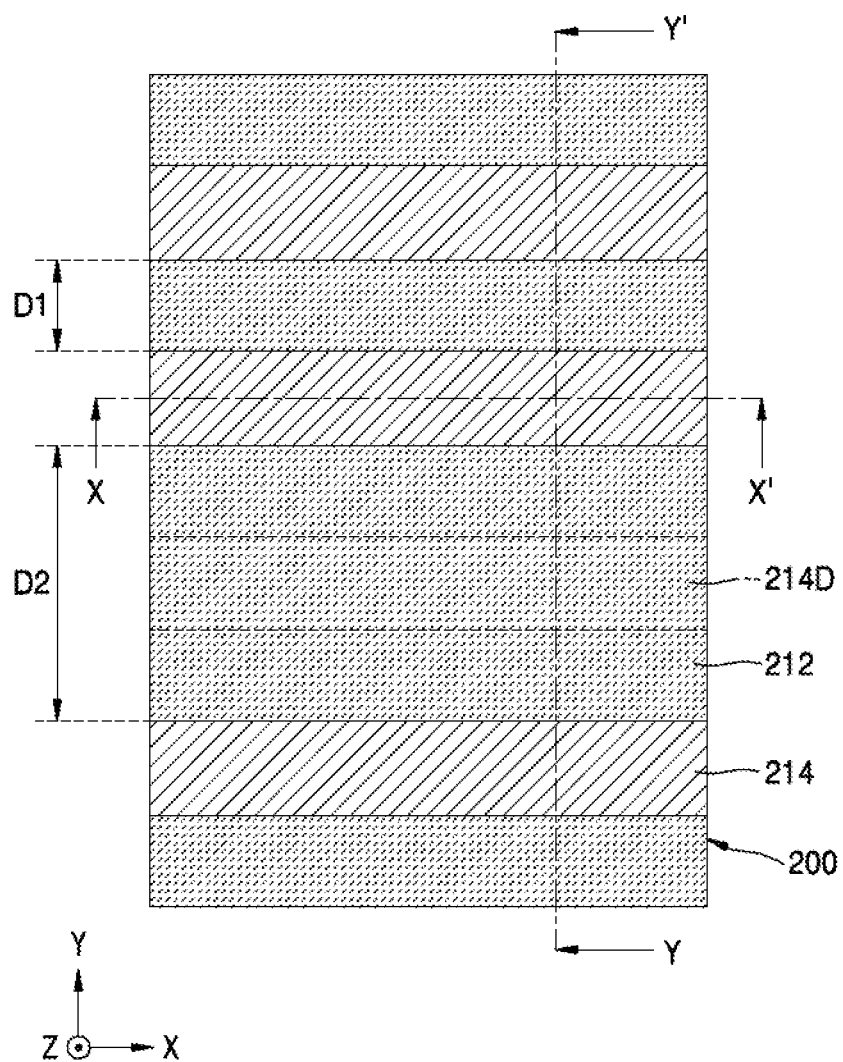
FIGS. 12A through 12C, 13A through 13C, 14A through 14C, 15A through 15C, 16A through 16C, and 17A through 17C are drawings illustrating a method of fabricating a semiconductor device according to a process sequence, according to an exemplary embodiment of the present inventive concept.
Figure 12B:
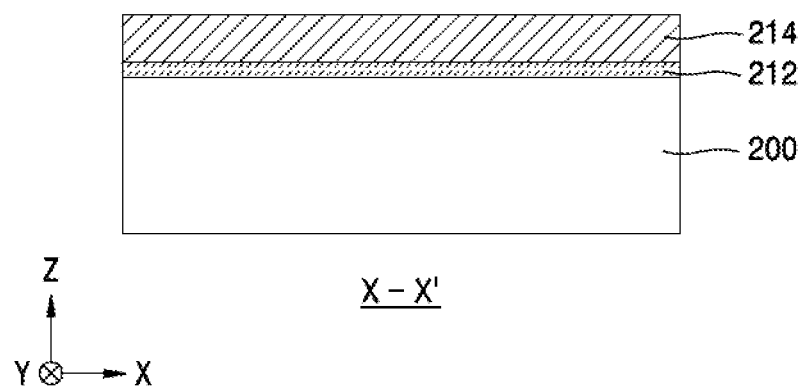
Figure 12C:
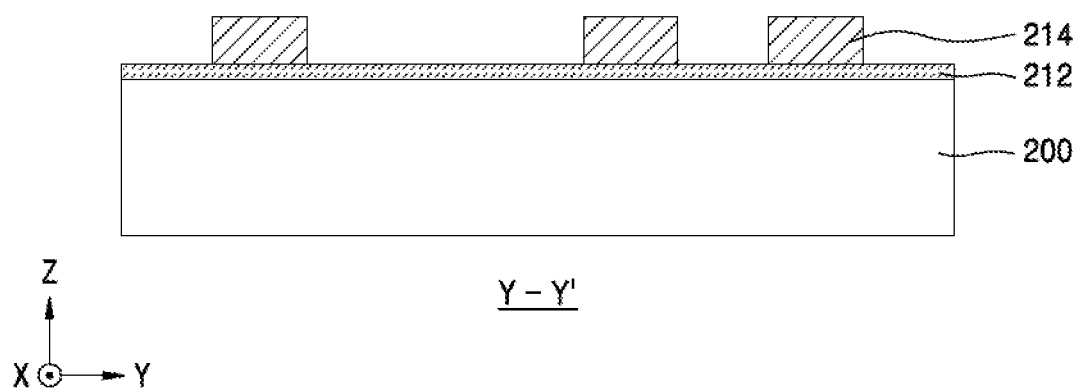
Figure 13A:
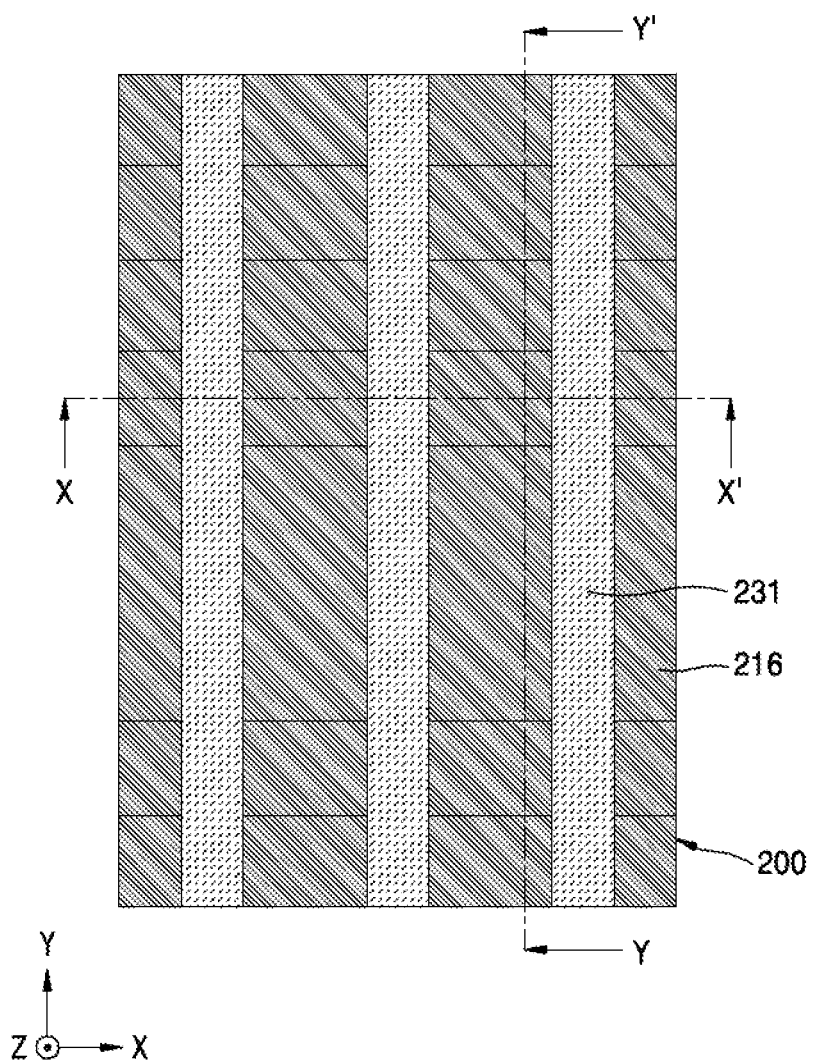
Figure 13B:
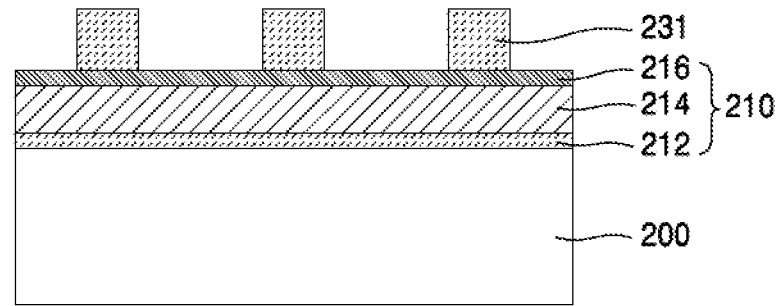
Figure 13B:
Figure 13C:
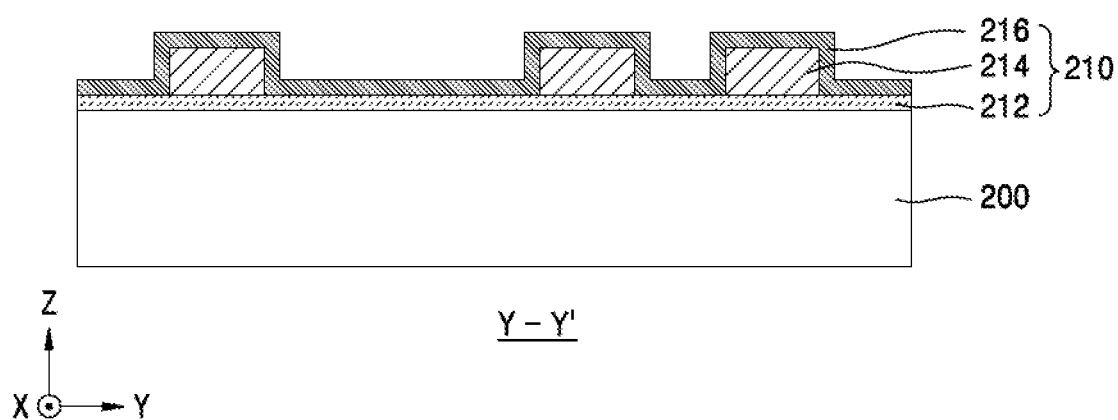

FIGS. 12A, 13A, ..., and 17A respectively correspond to layouts, FIGS. 12B, 13B, ..., and 17B respectively correspond to cross-sectional views taken along line X-X' of FIGS. 12A, 13A, ..., and 17A, and FIGS. 12C, 13C, ..., and 17C respectively correspond to cross-sectional views taken along line Y-Y' of FIGS. 12A, 13A, ..., and 17A.

Referring to FIGS. 12A through 12C, the lower insulating layer 212 and the gate electrode 214 may be formed on the substrate 200.

The lower insulating layer 212 may include at least one of, for example, silicon oxide ($SiO_2$), silicon nitride ($Si_3N_4$), or aluminum oxide ($Al_2O_3$). In an exemplary embodiment of the present inventive concept, the lower insulating layer 212 may function as a buffer layer for reducing stress due to a lattice constant difference of materials constituting other components which are arranged on and under the lower insulating layer 212. Also, the lower insulating layer 212 may prevent impurities from diffusing into components which are arranged on and above the lower insulating layer 212 from the substrate 200. In addition, the lower insulating layer 212 may function as a barrier layer for preventing a leakage of electric current.

The gate electrode 214 may be formed on the lower insulating layer 212. The gate electrode 214 may include, for example, doped polysilicon (p-Si), a metal, or a combination thereof. The gate electrodes 214 may extend in the first direction (X direction), and may be spaced apart from each other in the second direction (Y direction). In other words, the gate electrode 214 may form the gate line.

The gate electrode 214 may be formed by using, for example, double patterning technology (DPT) or quadruple patterning technology (QPT).

An ultra-fine pattern that transcends an optical limit may be formed by using the DPT. In other words, a first mask pattern having a width greater than a minimum feature size may be formed through a photolithography process, and a second mask pattern having a width of the minimum feature size may be formed by using the first mask pattern. Two line patterns constituting the second mask pattern, for each line pattern constituting the first mask pattern, may be formed. By using the second mask pattern as an etch mask, a plurality of gate electrodes 214 finally having the width of the minimum feature size may be formed. This kind of technique can print very fine features by doubling, quadrupling or sextupling the pattern density with multiple deposition and etching schemes.

In an exemplary embodiment of the present inventive concept, the plurality of gate electrodes 214 may include at least two of the gate electrodes 214 adjacent to each other with the first interval distance D1, and at least two of the gate electrodes 214 adjacent to each other with the second interval distance D2 greater than the first interval distance D1 in the second direction (Y direction). In other words, the distances between the plurality of gate electrodes 214 may not be identical to each other. In other words, a gate devoid region 214D in which the gate electrode 214 is not formed may be formed on the lower insulating layer 212. For example, the gate devoid region 214D may have a width of the gate electrode 214 within the second interval distance D2.

Referring to FIGS. 13A through 13C, the gate dielectric layer 216 may be formed to conformally cover top surfaces of the lower insulating layer 212 and the gate electrode 214, and the blocking insulating layer 231 may be formed to extend in a direction, for example, in the second direction (Y direction), to cross the gate electrode 214.

The gate dielectric layer 216 may include, for example, a silicon oxide ($SiO_2$) layer, a silicon oxynitride (SiON) layer, a high dielectric constant layer having a dielectric constant higher than that of the silicon oxide ($SiO_2$) layer, or a combination thereof. The high dielectric constant layer may include, for example, metal oxide or metal oxynitride.

The lower insulating layer 212, the gate electrode 214, and the gate dielectric layer 216 may be referred to as components of the gate structure 210.

The blocking insulating layer 231 may include at least one of, for example, silicon oxide ($SiO_2$), silicon nitride ($Si_3N_4$), or aluminum oxide ($Al_2O_3$). The blocking insulating layers 231 may extend in the second direction (Y direction), and may be spaced apart from each other in the first direction (X direction). In other words, the blocking insulating layer 231, which has a certain thickness, and the gate electrode 214 may perpendicularly cross each other.

Figure 14A:
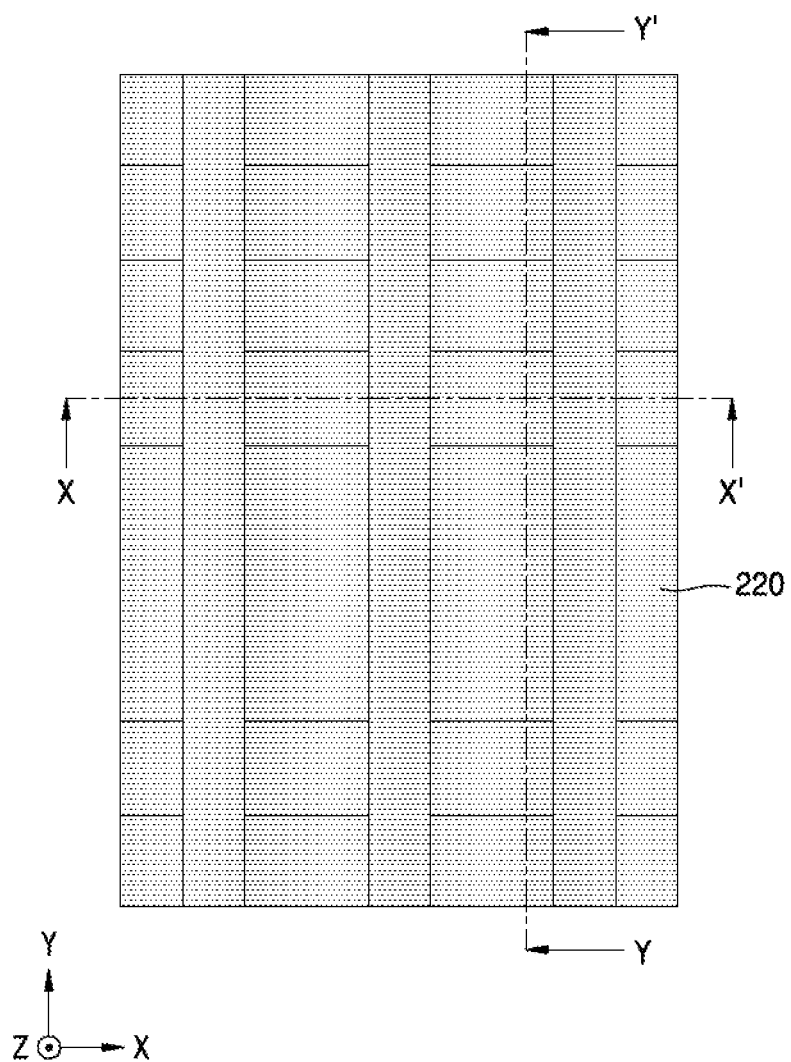
Figure 14B:
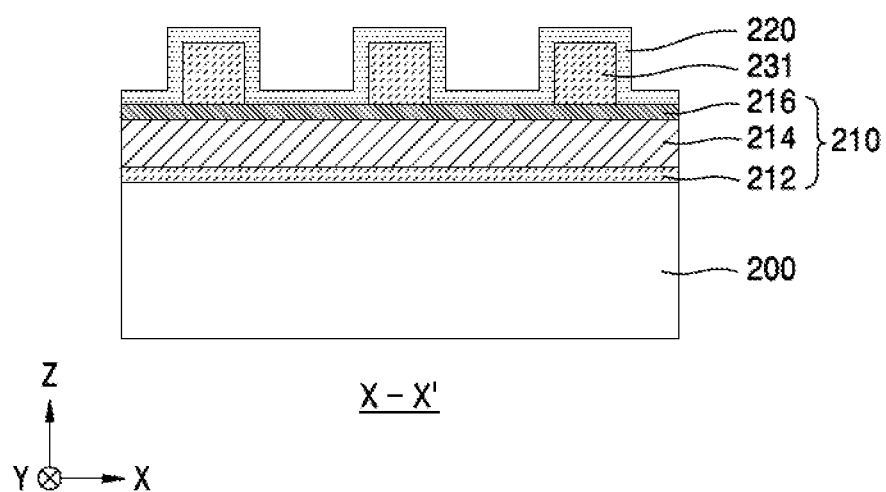
Figure 14C:
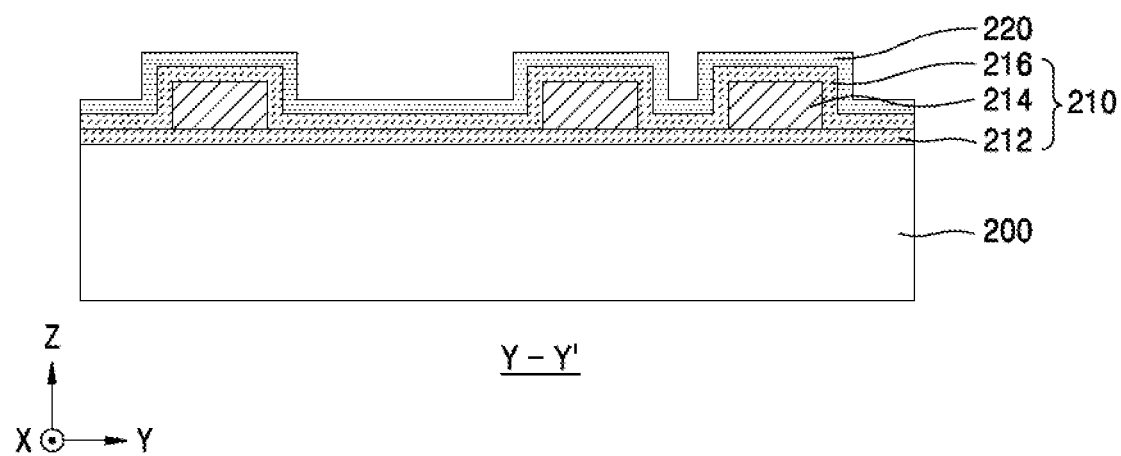

Referring to FIGS. 14A through 14C together, the oxide semiconductor layer 220 may be conformally formed on the gate dielectric layer 216 and the blocking insulating layer 231.

The oxide semiconductor layer 220 may have the top surface of an uneven structure, and a level of the top surface of the oxide semiconductor layer 220 may be higher than the level of the top surface of the substrate 100.

The oxide semiconductor layer 220 may include an oxide having electrical conductivity. For example, the oxide semiconductor layer 220 may include at least one of, for example, indium gallium zinc oxide (InGaZnO), indium gallium silicon oxide (InGaSiO), indium tin zinc oxide (InSnZnO), indium zinc oxide (InZnO), or hafnium indium zinc oxide (HfInZnO).

The oxide semiconductor layers 220 may be continuously connected to each other on the top surface of the whole surface of the substrate 200 or in the plurality of active regions AR. In other words, the oxide semiconductor layer 220 may be formed without discontinuity across the top surface of the substrate 200 or without a breakage across the active region AR and the device isolation region IR of the substrate 200.

Figure 15A:
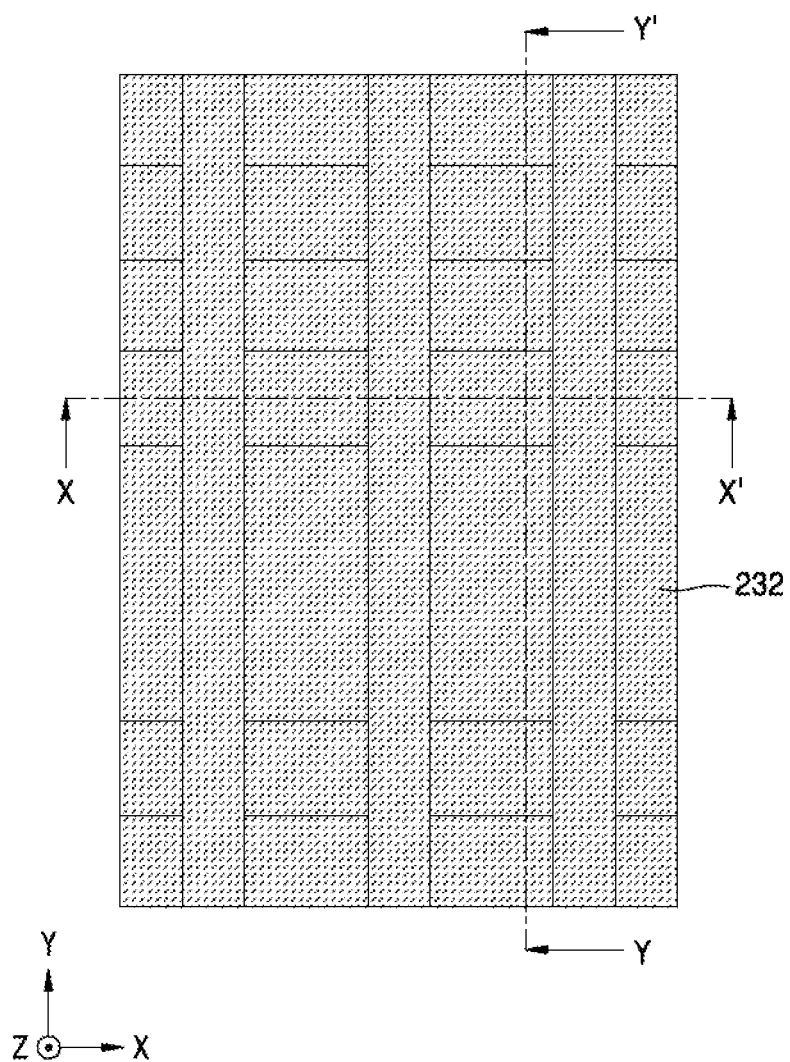
Figure 15B:
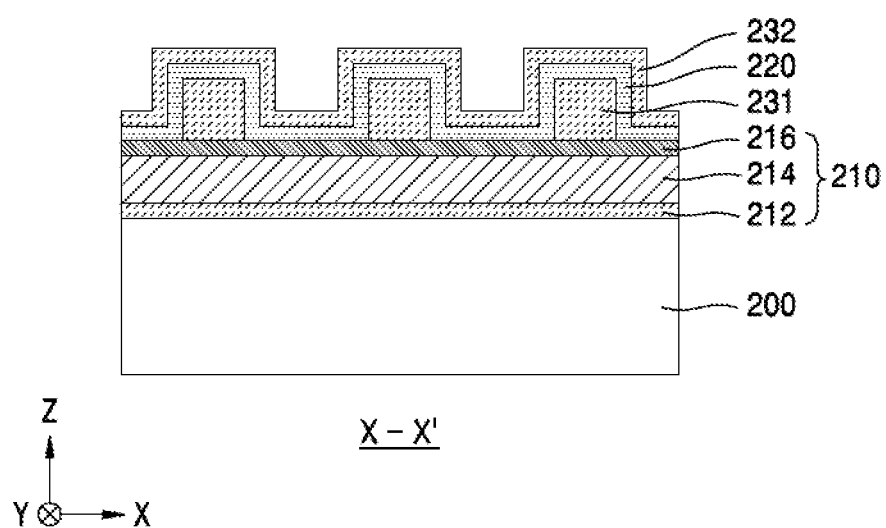
Figure 15C:
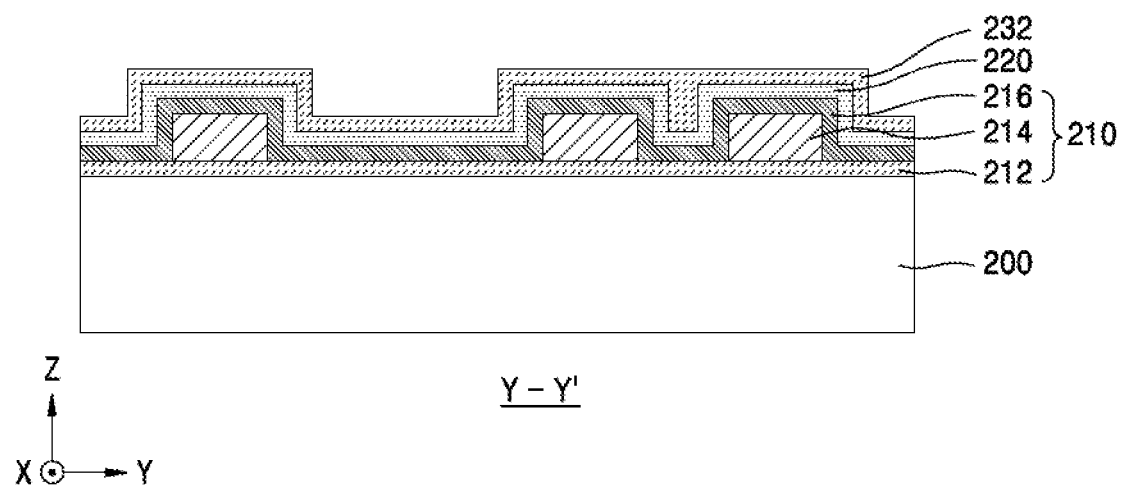

Referring to FIGS. 15A through 15C together, the upper insulating layer 232 may be conformally formed on the oxide semiconductor layer 220.

The upper insulating layer 232 may include at least one of, for example, silicon oxide ($SiO_2$), silicon nitride ($Si_3N_4$), or aluminum oxide ($Al_2O_3$). The upper insulating layer 232 may have the top surface of an uneven structure having substantially the same phase as the oxide semiconductor layer 220, and the level of the top surface of the upper insulating layer 232 may be higher than the level of the top surface of the substrate 200.

In an exemplary embodiment of the present inventive concept, the upper insulating layer 232 may include a relatively flexible insulating material, may cover the oxide semiconductor layer 220, and may have a flat (or gradual) top surface.

Figure 16A:
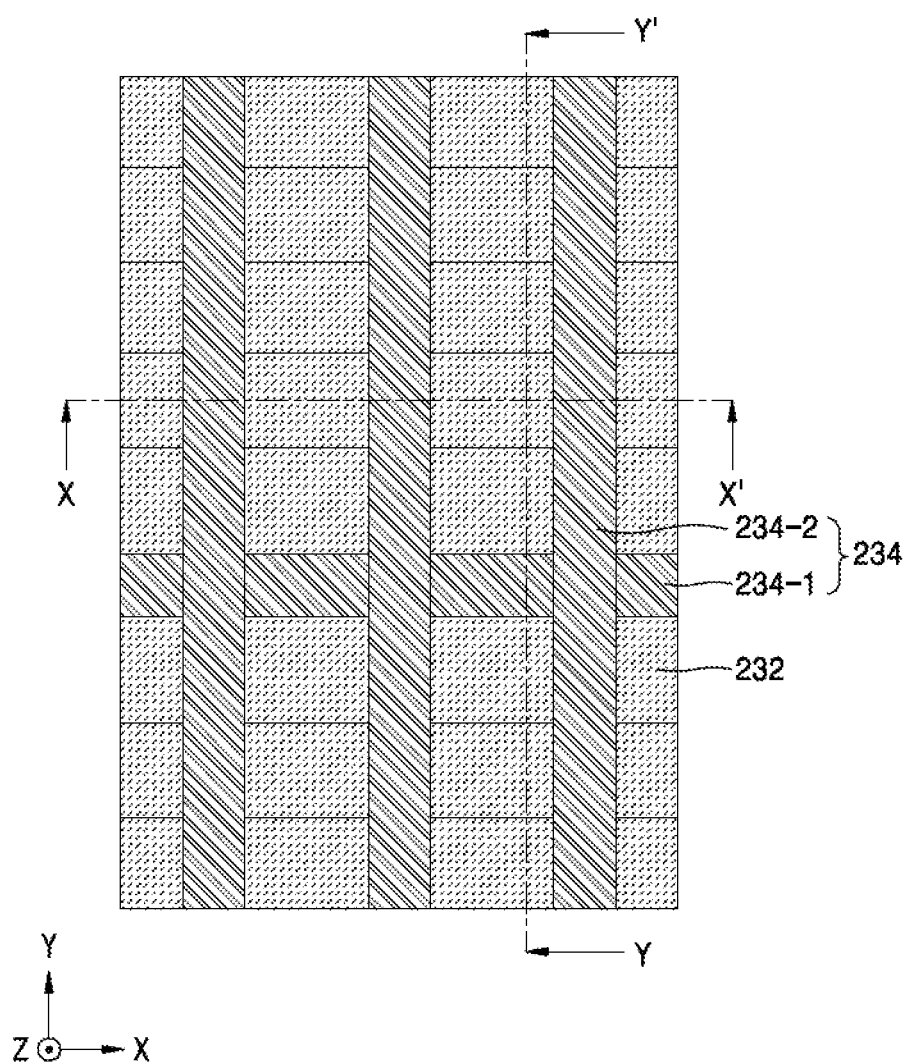
Figure 16B:
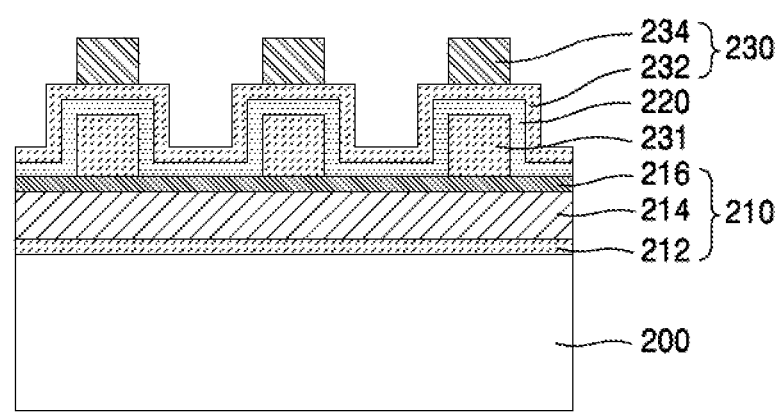
Figure 16B:
Figure 16C:
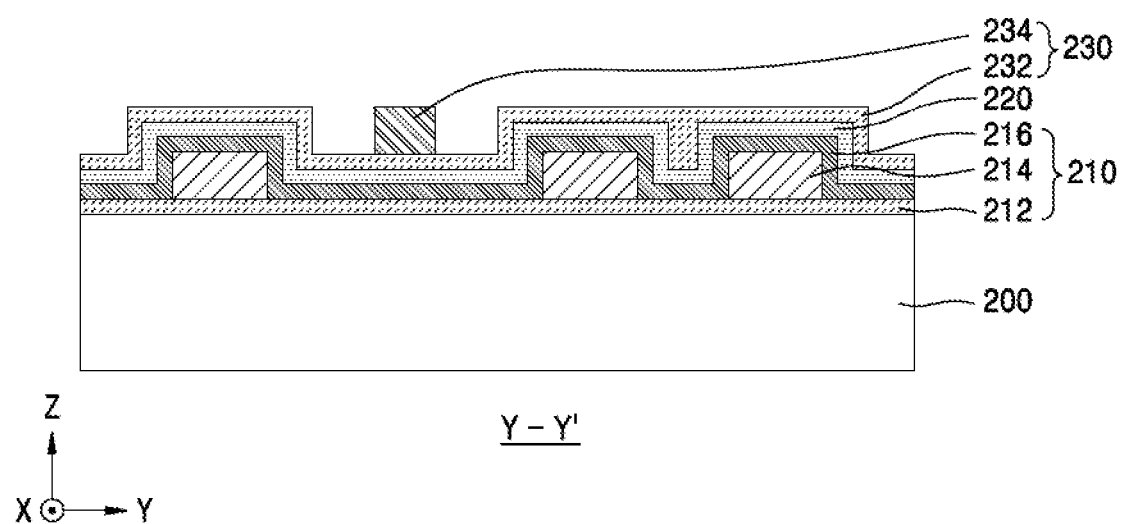

Referring to FIGS. 16A through 16C together, the upper gate metal layer 234 may be formed on the upper insulating layer 232 and extending in a direction, for example, in the second direction (Y direction), to cross the gate electrode 214, and also extending in a direction, for example, in the first direction (X direction), to be in parallel with the gate electrode 214.

The upper gate metal layer 234 may include, for example, doped polysilicon (p-Si), metal, metal nitride, metal silicide, or a combination thereof. In an exemplary embodiment of the present inventive concept, the upper gate metal layer 234 may include at least one of, for example, nickel (Ni), cobalt (Co), or ruthenium (Ru).

The upper gate metal layer 234 may include the first upper gate metal layer 234-1 formed between the gate electrodes 214, and the second upper gate metal layer 234-2 formed on the blocking gate insulating layer 231.

The first upper gate metal layers 234-1 may extend in the first direction (X direction), and may be spaced apart from each other in the second direction (Y direction). In addition, the second upper gate metal layers 234-2 may extend in the second direction (Y direction), and may be spaced apart from each other in the first direction (X direction). In other words, the first upper gate metal layer 234-1 and the second upper gate metal layer 234-2 may perpendicularly cross each other. For example, the first upper gate metal layer 234-1 may be formed in the gate devoid region (refer to 214D in FIG. 12A) in which the gate electrode 214 is not formed.

In an exemplary embodiment of the present inventive concept, the level of the top surface of the first upper gate metal layer 234-1 may be lower than the level of the bottom surface of the second upper gate metal layer 234-2. This may be because the second upper gate metal layer 234-2 is arranged on the blocking insulating layer 231 having a certain thickness.

The upper insulating layer 232 and the upper gate metal layer 234 may be referred to as components of the upper structure 230.

Figure 17A:
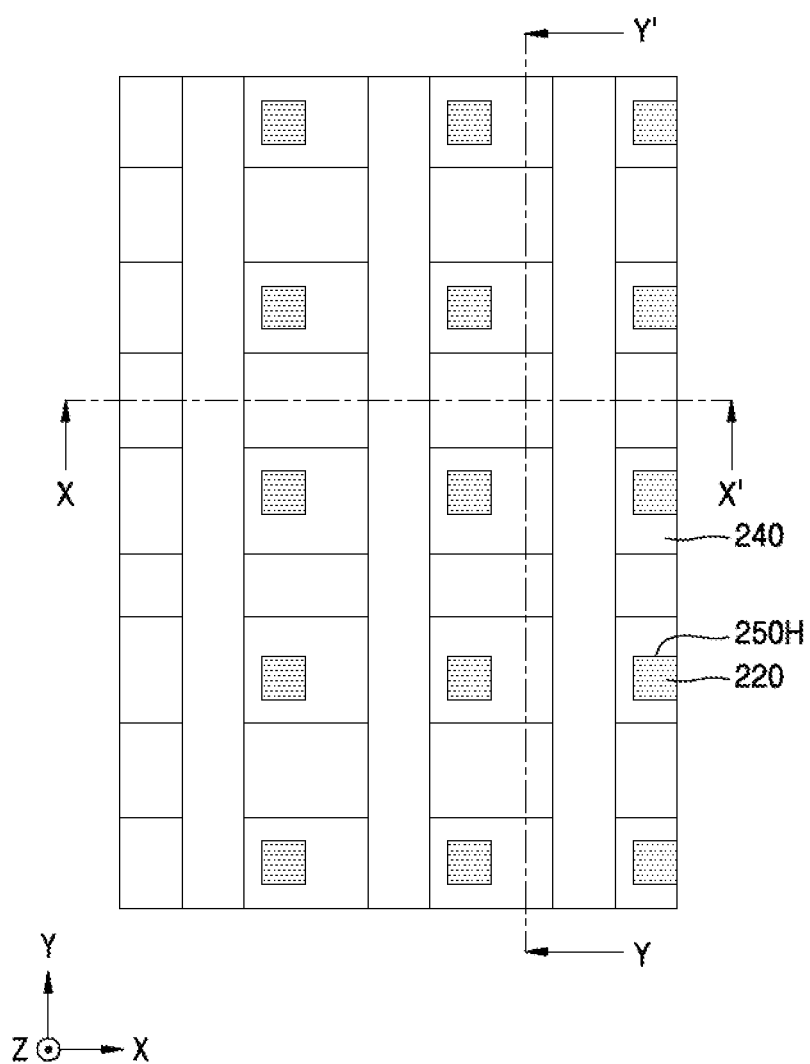
Figure 17B:
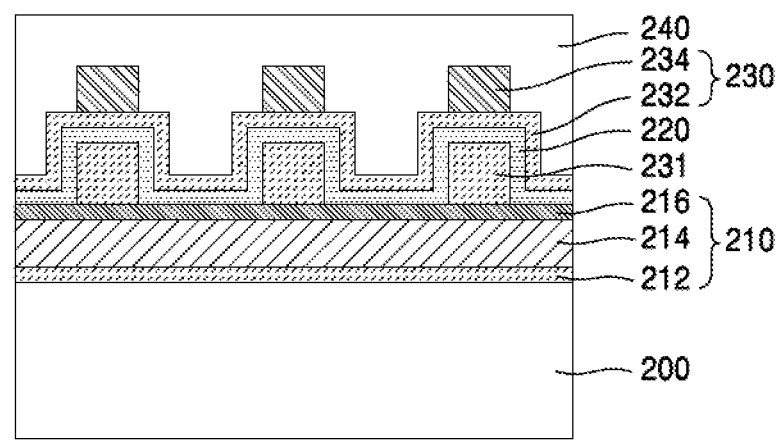
Figure 17B:
Figure 17C:
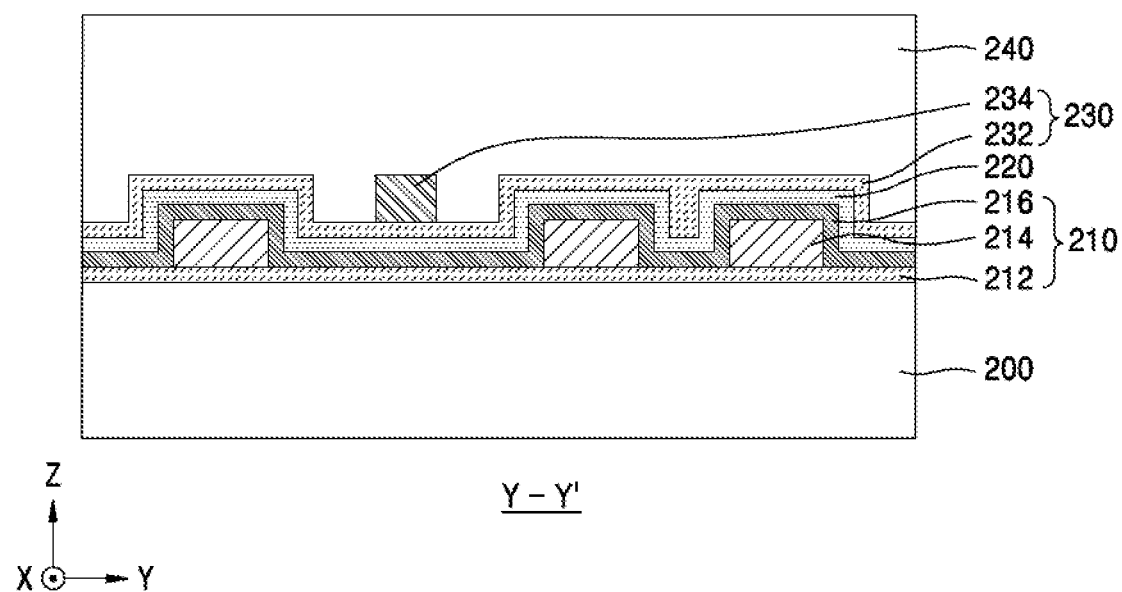

Referring to FIGS. 17A through 17C together, the interlayer insulating layer 240 may be formed on the upper structure 230.

The interlayer insulating layer 240 may include, for example, silicon oxide ($SiO_2$), silicon nitride ($Si_3N_4$), silicon oxynitride (SiON), tetraethyl orthosilicate (TEOS), or a low dielectric material. As an example, the low-k dielectric material may include carbon-doped silicon oxide, such as SiCOH. A mask pattern may be formed on the interlayer insulating layer 240, and the contact hole 250H penetrating the interlayer insulating layer 240 may be formed by using the mask pattern as an etch mask.

The mask pattern may be formed on the interlayer insulating layer 240 by a lithography process. By applying the photoresist and patterning the photoresist through exposure and development processes, the mask pattern may be formed. In this case, the contact hole 250H may be defined by the mask pattern. In an exemplary embodiment of the present inventive concept, the mask pattern may be formed through a process using an EUV ray. For example, the EUV ray may be used in the exposure process during the process of patterning the photoresist.

By etching the interlayer insulating layer 240 using the mask pattern as an etch mask, the contact hole 250H may be formed. The contact hole 250H may have a tapered profile in which the upper width is greater than the lower width.

Referring again to FIG. 5B, by forming a conductive layer filling the contact hole 250H on the interlayer insulating layer 240, and removing the upper portion of the conductive layer by CMP until the upper surface of the interlayer insulating layer 140 is exposed, the contact plug 250 filling the contact hole 250H may be formed. The contact plug 250 may include, for example, doped polysilicon (p-Si), metal, metal nitride, metal silicide, or a combination thereof.

By using these fabricating processes, the semiconductor device 50 according to an exemplary embodiment of the present inventive concept may be fabricated, and because the fabricating process of the semiconductor device 50 is simplified, the productivity and economic efficiency of the semiconductor device 50 may be enhanced.

Figure 18:
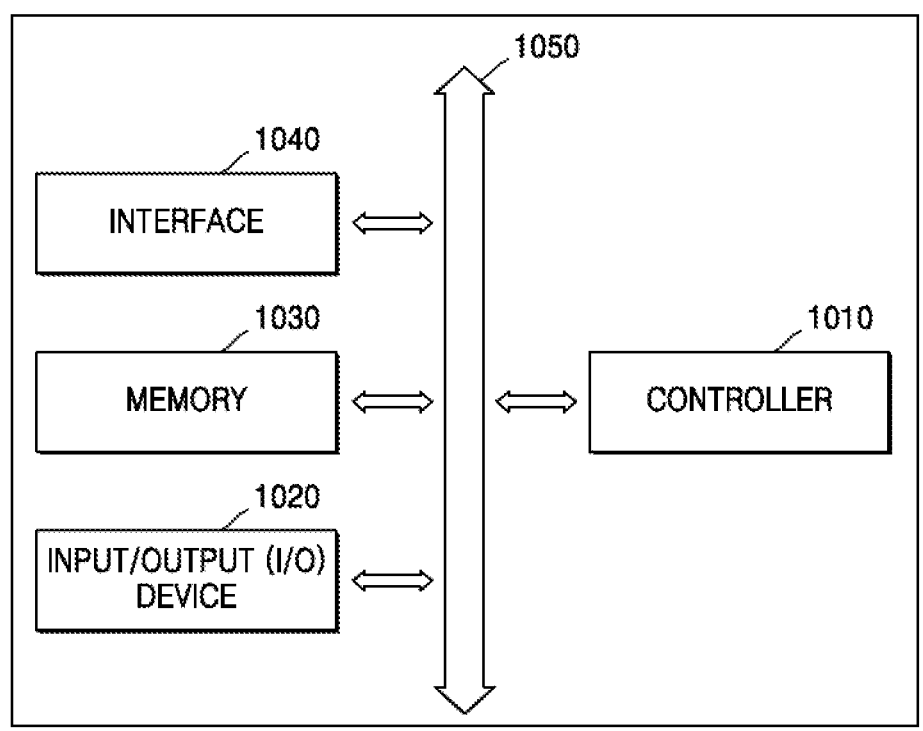
FIG. 18 is a configuration diagram of a system of a semiconductor module, according to an exemplary embodiment of the present inventive concept.

FIG. 18 is a configuration diagram of a system 1000 of a semiconductor module, according to an exemplary embodiment of the present inventive concept.

Referring to FIG. 18, the system 1000 may include a controller 1010, an input/output (I/O) device 1020, a memory 1030, an interface 1040, and a bus 1050.

The system 1000 may be a mobile system or a system which transceiver information. In an exemplary embodiment of the present inventive concept, the mobile system may include, for example, a portable computer, a tablet, a mobile phone, a smart watch, a digital music player, a memory card, etc.

The controller 1010 may be for controlling execution programs in the system 1000, and may include, for example, a microprocessor, a digital signal processor, a micro-controller, or a similar device.

The I/O device 1020 may be used to input or output data of the system 1000. The system 1000 may be connected to an external device, for example, a computer or a network through the I/O device 1020, and may exchange data with the external device. The I/O device 1020 may include, for example, a touch pad, a keyboard, a mouse, or a display.

The memory 1030 may store data for an operation of the controller 1010, or may store data processed by the controller 1010. The memory 1030 may include any one of the semiconductor devices 10 through 50 described above with reference to FIGS. 1A through 5C according to an exemplary embodiment of the present inventive concept.

The interface 1040 may be a data transmission path between the system 1000 and the external device. The controller 1010, the I/O device 1020, the memory 1030, and the interface 1040 may communicate with each other via the bus 1050.

Although exemplary embodiments of the present inventive concept have been described with reference to the accompanying drawings, it should be appreciated by those of ordinary skill in the art that the present inventive concept may be implemented in other particular applications without changing the technical aspect or essential characteristics thereof. Thus, the exemplary embodiments described above should be understood as exemplary in all aspects and non-limiting.

While the present inventive concept has been particularly shown and described with reference to exemplary embodiments thereof, it will be understood that various changes in form and details may be made therein without departing from the spirit and scope of the present inventive concept as defined in the appended claims.

What is claimed is:

1. A semiconductor device comprising:
   a substrate comprising an active region and a device isolation region;
   a flat plate structure formed on the substrate;
   an oxide semiconductor layer covering a top surface of the flat plate structure and continuously arranged on a top surface of the substrate in the active region and the device isolation region;
   a gate structure arranged on the oxide semiconductor layer and comprising a gate dielectric layer and a gate electrode; and
   a source/drain region arranged on both sides of the gate structure and formed in the oxide semiconductor layer,
   wherein, when viewed from a side cross-section, an extending direction of the flat plate structure and an extending direction of the gate structure cross each other.

2. The semiconductor device of claim 1, wherein the oxide semiconductor layer comprises at least one of indium gallium zinc oxide (InGaZnO), indium gallium silicon oxide (InGaSiO), indium tin zinc oxide (InSnZnO), indium zinc oxide (InZnO), or hafnium indium zinc oxide (HfInZnO).

3. The semiconductor device of claim 1, further comprising a channel region formed inside the oxide semiconductor layer and arranged under the gate structure,
   wherein a top surface of the oxide semiconductor layer has a planar structure.

4. The semiconductor device of claim 1, wherein the gate dielectric layer surrounds side surfaces and a bottom surface of the gate electrode.

5. The semiconductor device of claim 1, wherein the flat plate structure comprises:
   a first insulating layer formed on the substrate;
   a lower gate metal layer formed on the first insulating layer; and
   a second insulating layer formed on the lower gate metal layer,
   wherein the lower gate metal layer is interposed between the first insulating layer and the second insulating layer.

6. The semiconductor device of claim 5, wherein the lower gate metal layer comprises at least one of nickel (Ni), cobalt (Co), or ruthenium (Ru).

7. The semiconductor device of claim 5, wherein the lower gate metal layer is continuously arranged on the top surface of the substrate in the active region and the device isolation region.

8. The semiconductor device of claim 5, further comprising a lower gate metal layer contact electrically connected to the lower gate metal layer.

9. The semiconductor device of claim 5, wherein the lower gate metal layer is arranged only in the device isolation region.

10. A semiconductor device comprising:
    a substrate configured to define a plurality of active regions;
    an insulating layer covering a top surface of the substrate;
    a gate electrode formed on the insulating layer and extending in a first direction;
    a gate dielectric layer covering the insulating layer and the gate electrode;
    an oxide semiconductor layer arranged on the gate dielectric layer and configured to form a channel region in each of the plurality of active regions;
    a plurality of contact structures electrically connected to the oxide semiconductor layer; and
    an upper gate metal layer formed between each adjacent two of the plurality of active regions,
    wherein a device isolation insulating layer, which is a physical device isolation structure formed after etching the oxide semiconductor to partition the oxide semiconductor, is not formed between each adjacent two of the plurality of active regions.

11. The semiconductor device of claim 10, wherein a top surface of the oxide semiconductor layer has an uneven structure, and continuously extends across the plurality of active regions.

12. The semiconductor device of claim 10, wherein the oxide semiconductor layer comprises at least one of indium gallium zinc oxide (InGaZnO), indium gallium silicon oxide (InGaSiO), indium tin zinc oxide (InSnZnO), indium zinc oxide (InZnO), or hafnium indium zinc oxide (HfInZnO).

13. The semiconductor device of claim 10, wherein the upper gate metal layer comprises at least one of nickel (Ni), cobalt (Co), or ruthenium (Ru).

14. The semiconductor device of claim 10, wherein a level of a bottom surface of each of the contact structures is higher than a level of a top surface of the gate electrode.

15. The semiconductor device of claim 10, further comprising a blocking insulating layer arranged between each adjacent two of the plurality of contact structures on the gate dielectric layer, and extending in a second direction perpendicular to the first direction.

16. The semiconductor device of claim 15, wherein the gate electrode is provided in plurality, and the plurality of gate electrodes comprise at least two of the gate electrodes adjacent to each other with a first interval distance in the second direction, and at least two of the gate electrodes adjacent to each other with a second interval distance greater than the first interval distance.

17. A semiconductor device comprising:
- a substrate comprising a device isolation region configured to define a plurality of active regions;
- a first insulating layer formed on the substrate;
- a lower gate metal layer covering all of the plurality of active regions and the device isolation region of the substrate, being on the first insulating layer, and being configured to operate for device isolation;
- a second insulating layer formed on the lower gate metal layer;
- an oxide semiconductor layer arranged on the second insulating layer and configured to form a channel region in each of the plurality of active regions, the oxide semiconductor layer being formed without a breakage across the plurality of active regions and the device isolation region;
- a plurality of gate structures each arranged on the channel region in each of the plurality of the active regions;
- a source/drain region arranged on both sides of each of the plurality of gate structures and formed in the oxide semiconductor layer;
- a contact structure electrically connected to the source/drain region; and
- a lower gate metal layer contact electrically connected to the lower gate metal layer.

18. The semiconductor device of claim 17, wherein a level of a bottom surface of the contact structure is higher than a level of a bottom surface of the lower gate metal layer contact.

19. The semiconductor device of claim 17, wherein, when about −0.5 V to about −1 V is applied to the oxide semiconductor layer via the lower gate metal layer, the oxide semiconductor layer is configured to operate in an insulated state.

20. The semiconductor device of claim 17, wherein a top surface of the lower gate metal layer has a planar structure,
- a top surface of the oxide semiconductor layer has a planar structure, and
- each of the plurality of gate structures is of planar type and comprises a gate dielectric layer, a gate electrode, and a gate spacer.

\* \* \* \* \*